US011764129B2

(12) United States Patent
Kao et al.

(10) Patent No.: US 11,764,129 B2
(45) Date of Patent: Sep. 19, 2023

(54) METHOD OF FORMING SHIELD STRUCTURE FOR BACKSIDE THROUGH SUBSTRATE VIAS (TSVS)

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Hsing-Chih Lin, Tainan (TW); Jen-Cheng Liu, Hsin-Chu (TW); Wei-Tao Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 81 days.

(21) Appl. No.: 17/355,534

(22) Filed: Jun. 23, 2021

(65) Prior Publication Data
US 2021/0320052 A1 Oct. 14, 2021

Related U.S. Application Data

(62) Division of application No. 16/553,222, filed on Aug. 28, 2019, now Pat. No. 11,062,977.
(Continued)

(51) Int. Cl.
*H01L 23/552* (2006.01)
*H01L 23/48* (2006.01)
(Continued)

(52) U.S. Cl.
CPC ........ *H01L 23/481* (2013.01); *H01L 21/3065* (2013.01); *H01L 21/761* (2013.01);
(Continued)

(58) Field of Classification Search
CPC ............ H01L 23/481; H01L 21/76224; H01L 21/76898; H01L 25/0657
(Continued)

(56) References Cited

U.S. PATENT DOCUMENTS 8,916,471 B1 * 12/2014 Yang ..................... H01L 23/481
257/621
9,842,774 B1 * 12/2017 Fang ................. H01L 21/02271
(Continued)

FOREIGN PATENT DOCUMENTS

CN 104867905 A 8/2015
CN 105633040 A 6/2016
(Continued)

OTHER PUBLICATIONS

Non-Final Office Action dated Oct. 28, 2020 for U.S. Appl. No. 16/553,222.
(Continued)

*Primary Examiner* — Phuc T Dang
(74) *Attorney, Agent, or Firm* — Eschweiler & Potashnik, LLC

(57) ABSTRACT

Various embodiments of the present application are directed towards an integrated circuit (IC) in which a shield structure blocks the migration of charge to a semiconductor device from proximate a through substrate via (TSV). In some embodiments, the IC comprises a substrate, an interconnect structure, the semiconductor device, the TSV, and the shield structure. The interconnect structure is on a frontside of the substrate and comprises a wire. The semiconductor device is on the frontside of the substrate, between the substrate and the interconnect structure. The TSV extends completely through the substrate, from a backside of the substrate to the wire, and comprises metal. The shield structure comprises a
(Continued)

PN junction extending completely through the substrate and directly between the semiconductor device and the TSV.

20 Claims, 20 Drawing Sheets

Related U.S. Application Data

(60) Provisional application No. 62/855,274, filed on May 31, 2019.

(51) Int. Cl.

| | | |
|---|---|---|
| *H01L 25/065* | (2023.01) | |
| *H01L 21/762* | (2006.01) | |
| *H01L 25/00* | (2006.01) | |
| *H01L 27/02* | (2006.01) | |
| *H01L 21/3065* | (2006.01) | |
| *H01L 21/761* | (2006.01) | |
| *H01L 21/768* | (2006.01) | |
| *H01L 23/60* | (2006.01) | |
| *H01L 23/528* | (2006.01) | |
| *H01L 29/66* | (2006.01) | |
| *H01L 23/00* | (2006.01) | |
| *H01L 29/06* | (2006.01) | |
| *H01L 29/78* | (2006.01) | |
| *H01L 23/522* | (2006.01) | |

(52) U.S. Cl.
CPC .. *H01L 21/76224* (2013.01); *H01L 21/76898* (2013.01); *H01L 23/60* (2013.01); *H01L 25/0657* (2013.01); *H01L 25/50* (2013.01); *H01L 27/0255* (2013.01); *H01L 27/0296* (2013.01); *H01L 23/5226* (2013.01); *H01L 23/5283* (2013.01); *H01L 24/05* (2013.01); *H01L 24/08* (2013.01); *H01L 24/80* (2013.01); *H01L 29/0653* (2013.01); *H01L 29/66689* (2013.01); *H01L 29/7816* (2013.01); *H01L 2224/05571* (2013.01); *H01L 2224/08147* (2013.01); *H01L 2224/80357* (2013.01); *H01L 2224/80895* (2013.01); *H01L 2224/80896* (2013.01); *H01L 2225/06544* (2013.01)

(58) Field of Classification Search
USPC .......................................................... 257/659
See application file for complete search history.

(56) References Cited

U.S. PATENT DOCUMENTS

| | | |
|---|---|---|
| 10,134,790 B1 | 11/2018 | Wu et al. |
| 2011/0241185 A1 | 10/2011 | Koester et al. |
| 2012/0211829 A1 | 8/2012 | Bartley et al. |
| 2014/0210058 A1 | 7/2014 | Lee et al. |
| 2015/0270167 A1 | 9/2015 | Lee et al. |
| 2016/0300871 A1 | 10/2016 | Borthakur et al. |
| 2018/0174948 A1 | 6/2018 | Butt et al. |
| 2019/0088544 A1* | 3/2019 | Yu .................. H01L 23/552 |
| 2019/0122996 A1* | 4/2019 | Lin .................. H01L 23/481 |
| 2019/0181096 A1 | 6/2019 | Wu et al. |

FOREIGN PATENT DOCUMENTS

| | | |
|---|---|---|
| TW | 201401507 A | 1/2014 |
| WO | 2005086216 A1 | 9/2005 |

OTHER PUBLICATIONS

Notice of Allowance dated Mar. 16, 2021 for U.S. Appl. No. 16/553,222.

* cited by examiner

US 11,764,129 B2

METHOD OF FORMING SHIELD STRUCTURE FOR BACKSIDE THROUGH SUBSTRATE VIAS (TSVS)

REFERENCE TO RELATED APPLICATIONS

This Application is a Divisional of U.S. patent application Ser. No. 16/553,222, filed on Aug. 28, 2019 (now U.S. Pat. No. 11,062,977, issued on Jul. 13, 2021), which claims the benefit of U.S. Provisional Application No. 62/855,274, filed on May 31, 2019. The contents of the above-referenced Patent Applications are hereby incorporated by reference in their entirety.

BACKGROUND

The semiconductor manufacturing industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs. Through substrate vias (TSVs) are one of the technologies that have enabled the stacking of 2D ICs into 3D ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
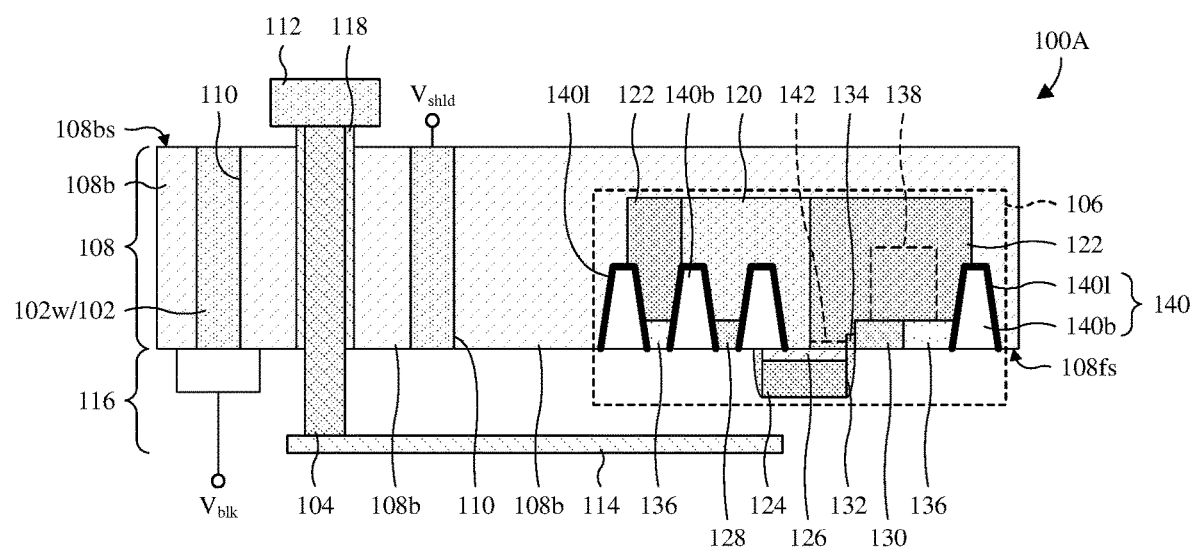
FIGS. 1A and 1B illustrate various views of some embodiments of an integrated circuit (IC) in which a shield structure comprises a single shield well extending in a closed path around a through substrate via (TSV) to separate the TSV from a semiconductor device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated circuit (IC) comprises a substrate, an interconnect structure, and a semiconductor device. The semiconductor device is on a frontside of the substrate and is partially defined by the substrate. The interconnect structure covers and electrically couples to the semiconductor device on the frontside of the substrate and comprises a wire. The IC further comprise a through substrate via (TSV) extending through the substrate, from a backside of the substrate to the wire. The TSV may, for example, facilitate electrical coupling of the interconnect structure to a pad on the backside of the substrate, to another IC on the backside, or some other structure on the backside.

During formation of the TSV, a plasma etch is performed into the backside of the substrate to form a via opening extending through the substrate. Plasma etching is employed because it may be highly directional and may hence form the TSV opening with an anisotropic etch profile. However, the plasma etch introduces charge into the substrate by way of free radicals. Depending upon proximity of the TSV opening and hence the TSV to the semiconductor device, the charge may migrate to the semiconductor device and become trapped in shallow trench isolation (STI) structures at the semiconductor device. For example, the STI structures may have silicon nitride liners that trap the charge at the STI structures. The trapped charge may, in turn, attract charge carriers at the semiconductor device and shift operating parameters of the semiconductor device out of specification. For example, the trapped charge and/or the attracted charge carriers may decrease a saturation current $I_{sat}$ of the semiconductor device by about 15%-17%, or by some other suitable value, when the semiconductor device is a high voltage N-channel metal-oxide-semiconductor (HV NMOS) device.

Various embodiments of the present application are directed towards an IC in which a shield structure blocks the migration of charge to a semiconductor device from proximate a TSV. In some embodiments, the IC comprises a substrate, an interconnect structure, the semiconductor device, the TSV, and the shield structure. The interconnect structure is on a frontside of the substrate and comprises a wire. The semiconductor device is on the frontside of the substrate, between the substrate and the interconnect structure. The TSV extends completely through the substrate, from a backside of the substrate to the wire, and comprises metal. The shield structure comprises a PN junction extending completely through the substrate and directly between the semiconductor device and the TSV.

By arranging the PN junction directly between the semiconductor device and the TSV, a depletion region blocks the migration of charge to the semiconductor device from proximate the TSV. Further, an electric field of the depletion region sweeps charge at the semiconductor device away from the semiconductor device. For example, charge trapped in STI structures at the semiconductor device may be dislodged and swept away from the semiconductor device. Hence, the PN junction prevents or otherwise reduces the accumulation of charge at the semiconductor device. Further yet, the PN junction may be reverse biased to enhance the effectiveness of the depletion region during operation of the semiconductor device. By preventing or otherwise reducing the accumulation of charge at the semiconductor device, operating parameters of the semiconductor device are minimally affected, if at all, by charge introduced into the substrate by plasma etching used to form the TSV. For example, a saturation current $I_{sat}$ of the semiconductor device may be minimally affected by the charge when the semiconductor device is an HV NMOS device or some other suitable device.

Figure 1B:
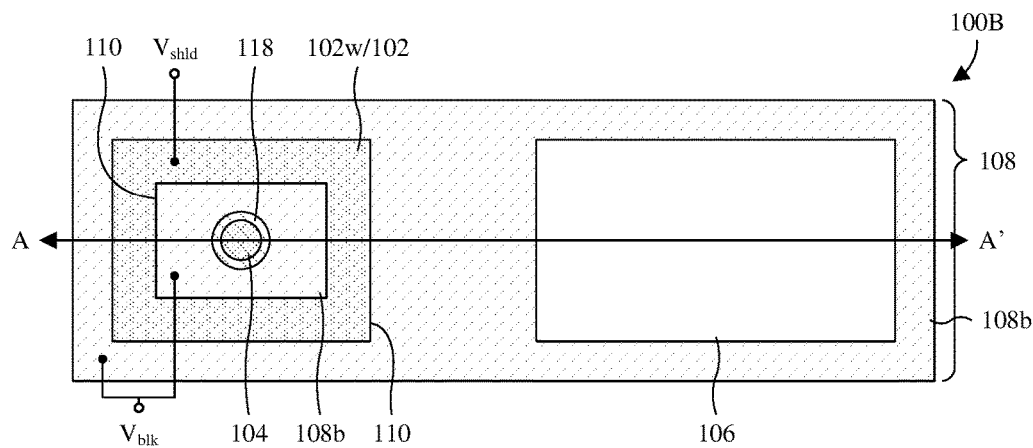

With reference to FIGS. 1A and 1B, various views 100A, 100B of some embodiments of an IC are provided in which a shield structure 102 comprises a single shield well 102w extending laterally in a closed path around a TSV 104 to separate the TSV 104 from a semiconductor device 106. FIG. 1A is a cross-sectional view 100A of the IC, and FIG. 1B is a top view 100B of the IC. The cross-sectional view 100A of FIG. 1A may, for example, be taken along line A-A' in the top view 100B of FIG. 1B.

The shield well 102w and hence the shield structure 102 are in a substrate 108. The substrate 108 may, for example, be a bulk monocrystalline silicon substrate or some other suitable semiconductor substrate. The shield well 102w extends vertically through an entirety of the substrate 108 (see FIG. 1A) and, as noted above, extends laterally in a closed path around the TSV 104 (see FIG. 1B). The closed path may, for example, be polygonal ring shaped, circular ring shaped, or some other suitable shape. The shield well 102w is a doped region of the substrate 108 having an opposite doping type as a bulk region 108b of the substrate 108. For example, the shield well 102w may be N-type and the bulk region 108b of the substrate 108 may be P-type or vice versa. Further, the shield well 102w adjoins the bulk region 108b of the substrate 108 so as to define PN junctions 110. The PN junctions 110 result in depletion regions separating the TSV 104 from the semiconductor device 106.

By separating the TSV 104 from the semiconductor device 106, the migration of charge to the semiconductor device 106 from proximate the TSV 104 is blocked by the depletion regions. As above, charge may, for example, be introduced into the substrate 108 during plasma etching to form the TSV 104 and may, for example, be carried by free radicals from the plasma etching. Further, electric fields of the depletion regions sweep charge at the semiconductor device 106 away from the semiconductor device 106. Hence, the PN junctions 110 prevent or otherwise reduce the accumulation of charge at the semiconductor device 106.

In embodiments, a shield voltage $V_{shld}$ and a bulk voltage $V_{blk}$ are respectively applied to the shield well 102w and the bulk region 108b of the substrate 108 to reverse bias the PN junctions 110. By reverse biasing the PN junctions 110, the depletion regions are larger and are hence more effective at blocking the migration of charge to the semiconductor device 106 and at sweeping charge away from the semiconductor device 106. In some embodiments in which the shield well 102w and the bulk region 108b of the substrate 108 are respectively N-type and P-type, the bulk voltage $V_{blk}$ and the shield voltage $V_{shld}$ are respectively at comparatively low and high voltages. For example, the bulk voltage $V_{blk}$ may be at a lowest voltage within the IC and the shield voltage $V_{shld}$ may be at a highest voltage within the IC.

The TSV 104 extends through the substrate 108, from a pad 112 on a backside 108bs of the substrate 108 to a wire 114 on a frontside 108fs of the substrate 108. The wire 114 is part of an interconnect structure 116 and, in some embodiments, partially underlies the semiconductor device 106. The wire 114 and the pad 112 are conductive and may, for example, be or comprise copper and/or some other suitable metal(s). The TSV 104 is separated from the substrate 108 by a TSV dielectric layer 118 that surrounds the TSV 104. The TSV 104 is conductive and may be or comprise, for example, copper, aluminum, some other suitable metal(s), or any combination of the foregoing.

The semiconductor device 106 is on the frontside 108fs of the substrate 108 and is partially defined by the substrate 108. In some embodiments, the semiconductor device 106 directly overlies a portion of the wire 114 and/or is electrically coupled to the interconnect structure 116. In some embodiments, the semiconductor device 106 is an asymmetric N-channel high voltage metal-oxide-semiconductor (HVMOS) transistor or some other suitable N-channel metal-oxide-semiconductor field-effect transistor (MOSFET). In other embodiments, the semiconductor device 106 is some suitable other type of semiconductor device. As used herein, an HVMOS transistor may, for example, be a laterally diffused metal-oxide-semiconductor (LDMOS) transistor or some other suitable transistor.

A first device well 120 and a second device well 122 extend into the substrate 108 from the frontside 108fs of the substrate 108, and the second device well 122 comprises a pair of segments between which the first device well 120 is sandwiched. The first and second device wells 120, 122 are doped regions of the substrate 108. The first device well 120 has a same doping type as the shield well 102w and an opposite doping type as the second device well 122. The second device well 122 has a same doping type as, but a different doping concentration than, the bulk region 108b of the substrate 108. For example, the second device well 122 may have a higher doping concentration than the bulk region 108b of the substrate 108.

A gate electrode 124 and a gate dielectric layer 126 are stacked on the frontside 108fs of the substrate 108 and straddle an interface at which the first device well 120 and the second device well 122 contact. Further, the gate electrode 124 and the gate dielectric layer 126 are sandwiched between a first source/drain region 128 and a second source/ drain region 130. The first and second source/drain regions 128, 130 are in the substrate 108 and respectively on the first device well 120 and the second device well 122. In some embodiments, a dielectric spacer 132 is on sidewalls of the gate electrode 124 and comprises a pair of segments between which the gate electrode 124 is sandwiched. In some embodiments, a source/drain extension 134 extends over the dielectric spacer 132 from the second source/drain region 130. The first and second source/drain regions 128, 130 and the source/drain extension 134 are doped regions of the substrate 108 having the same doping type as, but different doping concentrations than, the first device well 120. For example, the first and second source/drain regions 128, 130 may have a higher doping concentration than the first device well 120.

Second device-well contact regions 136 are on the second device well 122, respectively at opposite sides of the semiconductor device 106. The second device-well contact regions 136 are doped regions of the substrate 108 having a same doping type as, but a higher doping concentration than, the second device well 122. A second device-well contact region contacts the second source/drain region 130 and, in some embodiments, an isolation well 138 (shown in phantom) overlies and straddles an interface at which the second device-well contact region contacts the second source/drain region 130. The isolation well 138 is a doped region of the substrate 108 having a same doping type, but a different doping concentration than, the second device well 122. Another second device-well contact region neighbors the first source/drain region 128 and is separated therefrom by a trench isolation structure 140.

The trench isolation structure 140 also demarcates a boundary of the semiconductor device 106 and laterally separates the first source/drain region 128 from a portion of the first device well 120 overlying the gate electrode 124. The trench isolation structure 140 comprises a trench isolation body 140$b$ and a trench isolation liner 140$l$ separating the trench isolation body 140$b$ from the substrate 108. Note that the trench isolation body 140$b$ and the trench isolation liner 140$l$ are only labeled form some segments of the trench isolation structure 140. The trench isolation body 140$b$ may be or comprise, for example, silicon oxide and/or some other suitable dielectric(s). The trench isolation liner 140$l$ may be or comprise, for example, silicon nitride and/or some other suitable dielectric(s). The trench isolation structure 140 may be, for example, an STI structure or some other suitable trench isolation structure.

In operation, a bias voltage on the gate electrode 124 is controlled to change a channel region 142 in the second device well 122 between a non-conducting state and a conducting state. The channel region 142 extends from the second source/drain region 130 to the first device well 120, and the first device well 120 extends from the channel region 142 to the first source/drain region 128. The first device well 120 acts as a resistor to decrease the voltage across the channel region 142 and to allow the semiconductor device 106 to operate at higher voltages that it would otherwise be able to.

As noted above, the depletion regions at the shield structure 102 block the migration of charge from proximate the TSV 104 to the semiconductor device 106. Further, the depletion regions sweep charge at the semiconductor device 106 away from the semiconductor device 106. Absent the shield structure 102, charge may accumulate in the trench isolation structure 140. For example, positive charge introduced into the substrate 108 during formation of the TSV 104 may migrate on free radicals to the trench isolation structure 140 and accumulate in the trench isolation structure 140. Hence, the shield structure 102 prevents or otherwise reduces the accumulation of charge in trench isolation structure 140. Charge that accumulates in the trench isolation structure 140 may attract charge carriers at the semiconductor device 106 and shift operating parameters of the semiconductor device 106 out of specification. For example, positive charge that accumulates in the trench isolation structure 140 may attract electrons and decrease a saturation current $I_{sat}$ of the semiconductor device 106 out of specification. Hence, by preventing or otherwise reducing the accumulation of charge in trench isolation structure 140, the shield structure 102 prevents operating parameters of the semiconductor device 106 from being shifted out of specification and may hence increase manufacturing yields.

Figure 2A:
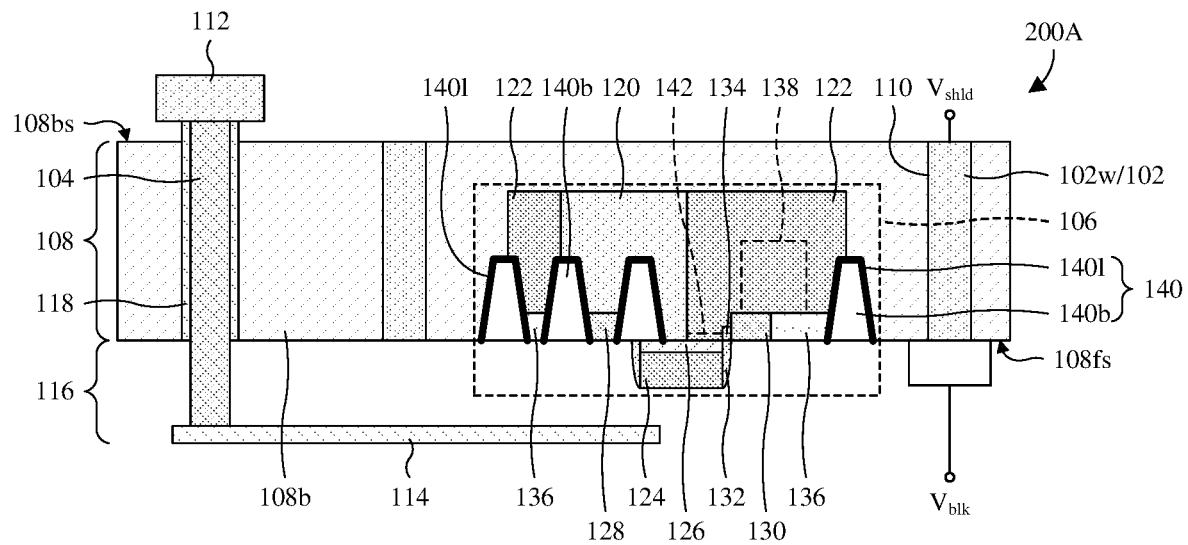
FIGS. 2A and 2B illustrate various views of some alternative embodiments of the IC of FIGS. 1A and 1B in which the single shield well extends in a closed path around the semiconductor device.
Figure 2B:
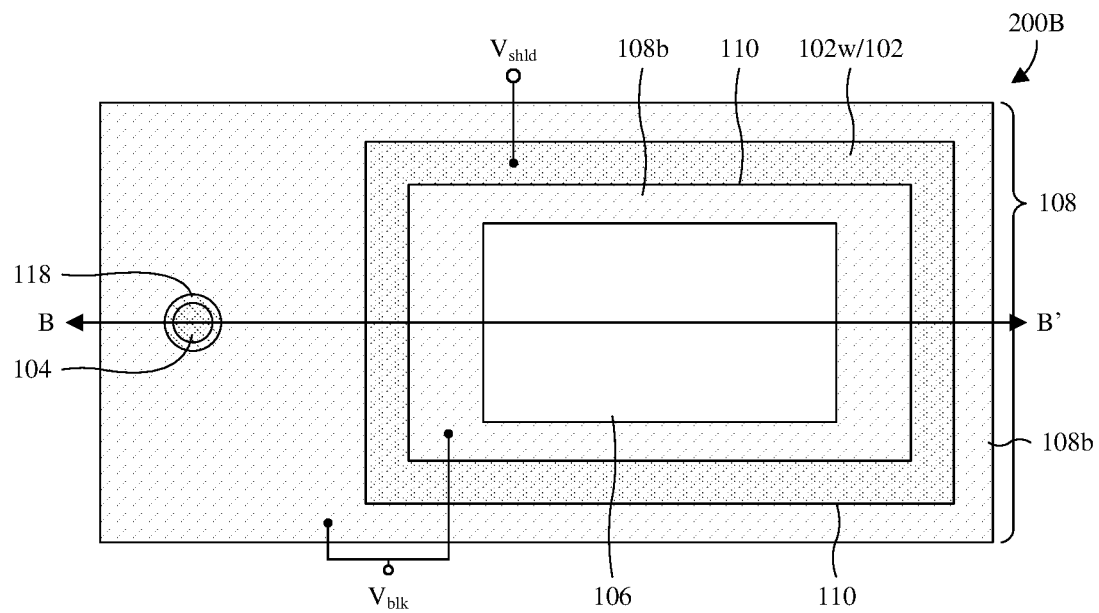

With reference to FIGS. 2A and 2B, various views 200A, 200B of some alternative embodiments of the IC of FIGS. 1A and 1B are provided in which the single shield well 102$w$ extends laterally in a closed path around the semiconductor device 106 instead of laterally in a closed path around the TSV 104. FIG. 2A is a cross-sectional view 200A of the IC, and FIG. 2B is a top view 200B of the IC. The cross-sectional view 200A of FIG. 2A may, for example, be taken along line B-B' in the top view 200B of FIG. 2B.

By surrounding the semiconductor device 106 with the single shield well 102$w$, the depletion regions of the single shield well 102$w$ block the migration of charge to the semiconductor device 106 from proximate the TSV 104. This is as described with regard to FIGS. 1A and 1B. Further, by surrounding the semiconductor device 106 instead of the TSV 104 with the single shield well 102$w$, the depletion regions of the single shield well 102$w$ additionally block noise from surrounding devices (not shown) from reaching and interfering with operation of the semiconductor device 106.

Figure 3A:
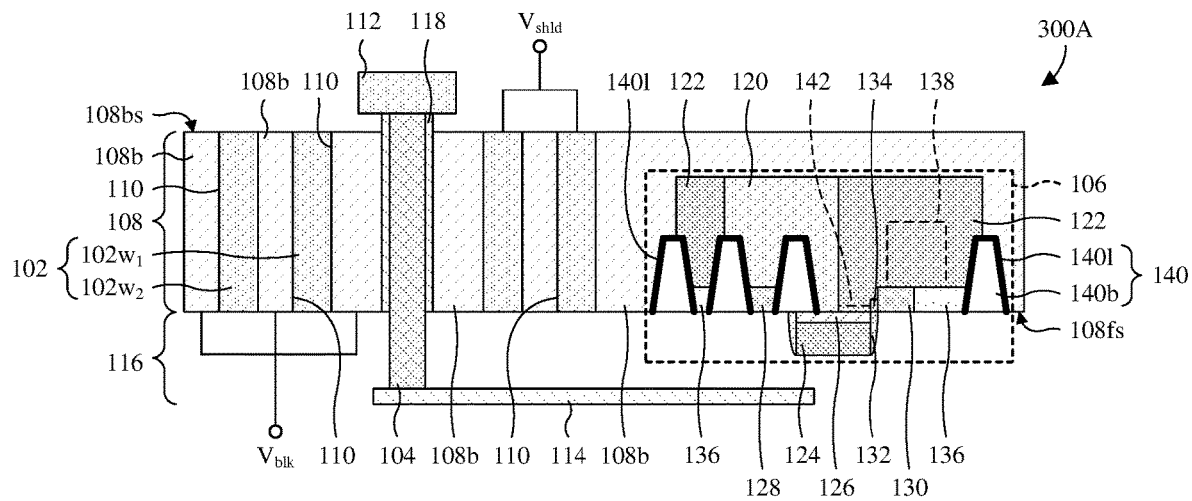
FIGS. 3A and 3B illustrate various views of some alternative embodiments of the IC of FIGS. 1A and 1B in which the shield structure comprises a pair of shield wells extending in a closed path around the TSV.
Figure 3B:
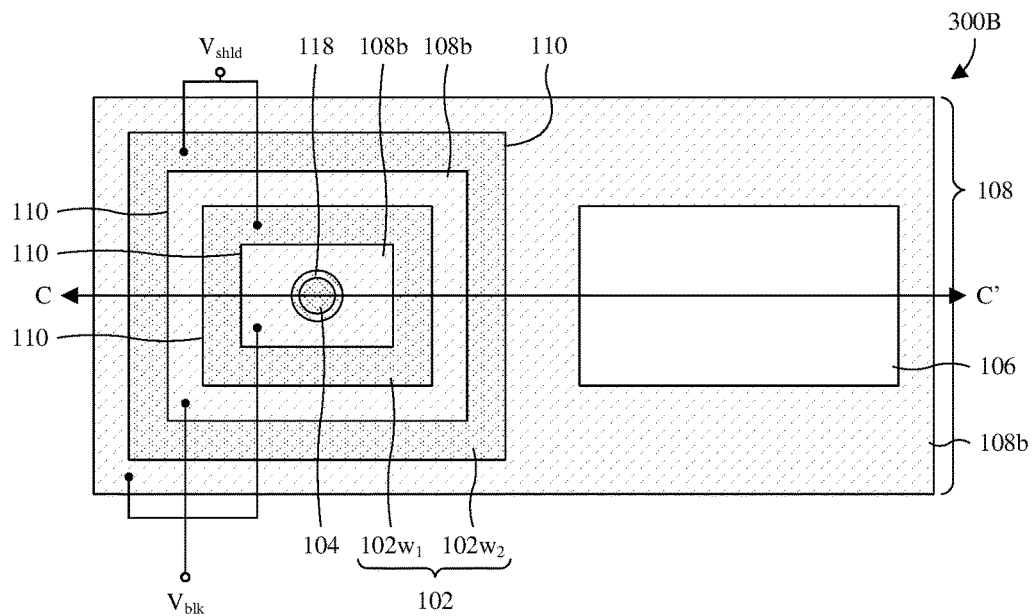

With reference to FIGS. 3A and 3B, various views 300A, 300B of some alternative embodiments of the IC of FIGS. 1A and 1B are provided in which the shield structure 102 comprises a first shield well 102$w_1$ and a second shield well 102$w_2$ extending laterally in individual closed paths around the TSV 104. This is in contrast with the single shield well 102$w$ of FIGS. 1A and 1B. FIG. 3A is a cross-sectional view 300A of the IC, and FIG. 3B is a top view 300B of the IC. The cross-sectional view 300A of FIG. 3A may, for example, be taken along line C-C' in the top view 300B of FIG. 3B.

The first and second shield well 102$w_1$, 102$w_2$ are each as the single shield well 102$w$ of the FIGS. 1A and 1B is described. The first and second shield wells 102$w_1$, 102$w_2$ extend vertically through an entirety of the substrate 108 (see FIG. 3A) and, as noted above, extend laterally in individual closed paths around the TSV 104 (see FIG. 3B). The closed paths may, for example, each be polygonal ring shaped, circular ring shaped, or some other suitable shape. Further, the second shield well 102$w_2$ extends laterally in its closed path around the first shield well 102$w_1$ so the first shield well 102$w_1$ is between the TSV 104 and the second shield well 102$w_2$. The first and second shield wells 102$w_1$, 102$w_2$ are doped regions of the substrate 108 having an opposite doping type as the bulk region 108$b$ of the substrate 108. Further, the first and second shield wells 102$w_1$, 102$w_2$ adjoin the bulk region 108$b$ of the substrate 108 so as to define PN junctions 110 with the bulk region 108$b$. The PN junctions 110 result in depletion regions separating the TSV 104 from the semiconductor device 106.

By separating the TSV 104 from the semiconductor device 106, the migration of charge to the semiconductor device 106 from proximate the TSV 104 is blocked by the depletion regions. Further, the depletion regions sweep charge at the semiconductor device 106 away from the semiconductor device 106. Hence, the PN junctions 110 prevent or otherwise reduce the accumulation of charge at the semiconductor device 106. By having both the first and second shield wells $102w_1$, $102w_2$, any charge that migrates past the depletion regions of the first shield well $102w_1$ still has to migrate past the depletion regions of the second shield well $102w_2$. Hence, having two shield wells provides multiple layers of shielding.

While FIGS. 3A and 3B are described with two shield wells, it is to be appreciated that alternative embodiments of the IC may have three or more shield wells extending laterally in individual closed paths around the TSV 104. In such alternative embodiments, the three or more shield wells are each as the shield well 102w of FIGS. 1A and 1B is described. Further, while the first and second shield wells $102w_1$, $102w_2$ of FIGS. 3A and 3B are illustrated as surrounding the TSV 104, the first and second shield wells $102w_1$, $102w_2$ may surround the semiconductor device 106, but not the TSV 104, in alternative embodiments of the IC.

Figure 4A:
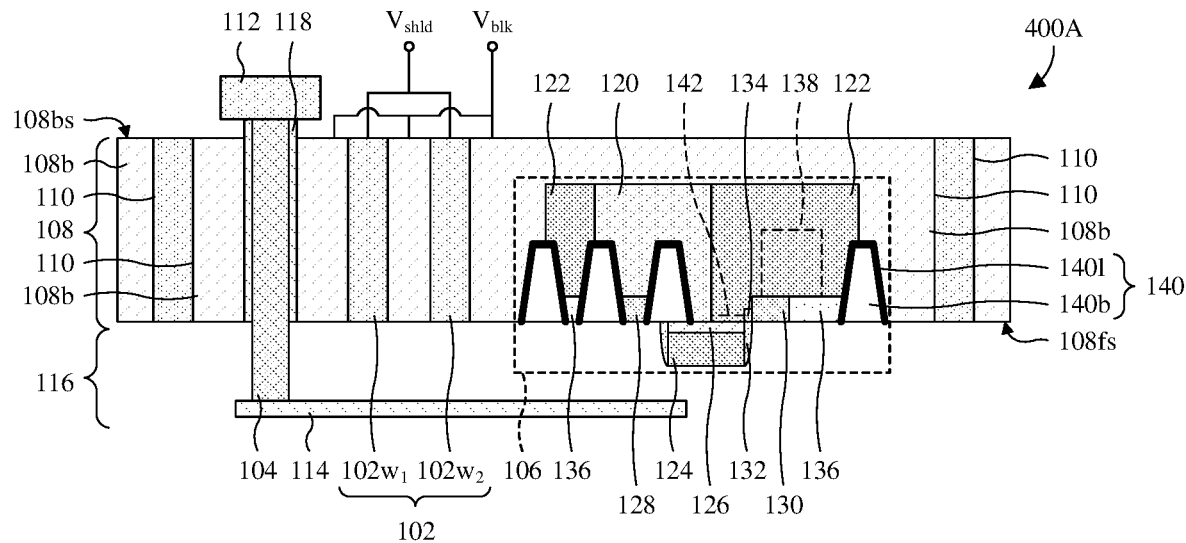
FIGS. 4A and 4B illustrate various views of some alternative embodiments of the IC of FIGS. 3A and 3B in which shield wells extend in closed paths respectively around the TSV and the semiconductor device.
Figure 4B:
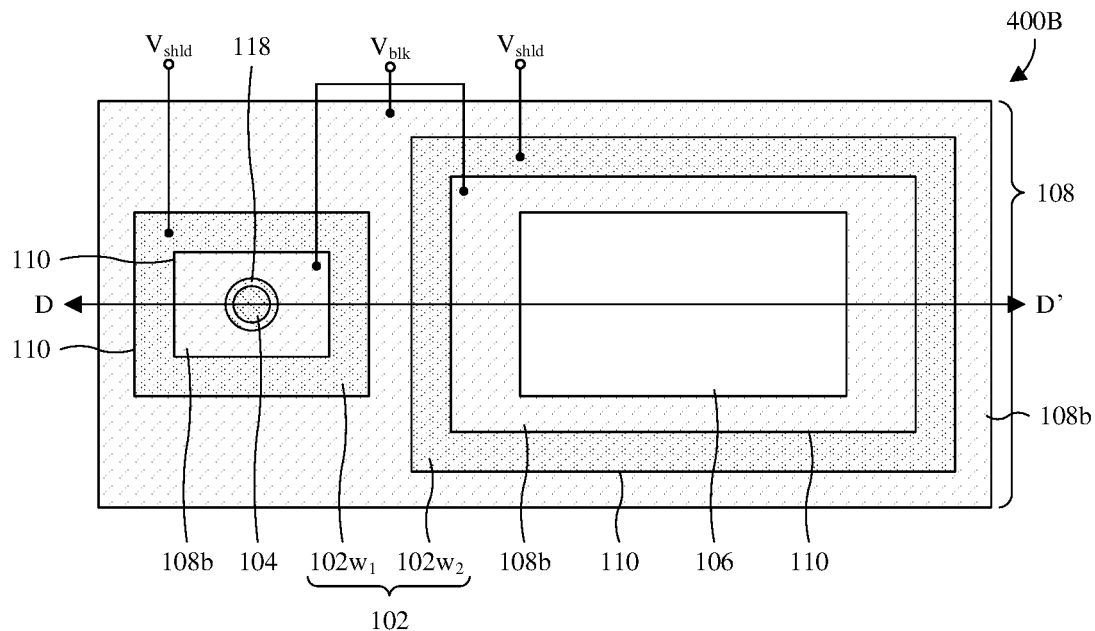

With reference to FIGS. 4A and 4B, various views 400A, 400B of some alternative embodiments of the IC of FIGS. 3A and 3B are provided in which the second shield well $102w_2$ extends laterally in a closed path around the semiconductor device 106 instead of TSV 104. The first shield well $102w_1$ continues to surround the TSV 104. FIG. 4A is a cross-sectional view 400A of the IC, and FIG. 4B is a top view 400B of the IC. The cross-sectional view 400A of FIG. 4A may, for example, be taken along line D-D' in the top view 400B of FIG. 4B.

By having both the first and second shield wells $102w_1$, $102w_2$ separating the TSV 104 from the semiconductor device 106, any charge that migrates past the depletion regions of the first shield well $102w_1$ still has to migrate past the depletion regions of the second shield well $102w_2$ to reach the semiconductor device 106. Hence, having two shield wells provides multiple layers of shielding. Further, by surrounding the semiconductor device 106 instead of the TSV 104 with the second shield well $102w_2$, the depletion regions of the second shield well $102w_2$ additionally block noise from surrounding devices (not shown) from reaching and interfering with operation of the semiconductor device 106.

While FIGS. 4A and 4B are described with a single shield well (i.e., the first shield well $102w_1$) surrounding the TSV 104 and a single shield well (i.e., the second shield well $102w_2$) surrounding the semiconductor device 106, multiple shield wells may surround the TSV 104 and/or multiple shield wells may surround the semiconductor device 106 in alternative embodiments. An example of multiple shield wells surrounding the TSV 104 is illustrated and described with regard to FIGS. 3A and 3B.

While FIGS. 1A, 2A, 3A, and 4A are described in relation to FIGS. 1B, 2B, 3B, and 4B, it will be appreciated that FIGS. 1A, 2A, 3A, and 4A may stand alone from FIGS. 1B, 2B, 3B, and 4B in some embodiments and FIGS. 1B, 2B, 3B, and 4B may stand alone from FIGS. 1A, 2A, 3A, and 4A in some embodiments. For example, while FIG. 1A is described as if the two segments of the single shield well 102w are connected out of view (as shown in FIG. 1B), that may not be the case in some embodiments. The two segments may be disconnected in some embodiments.

Figure 5:
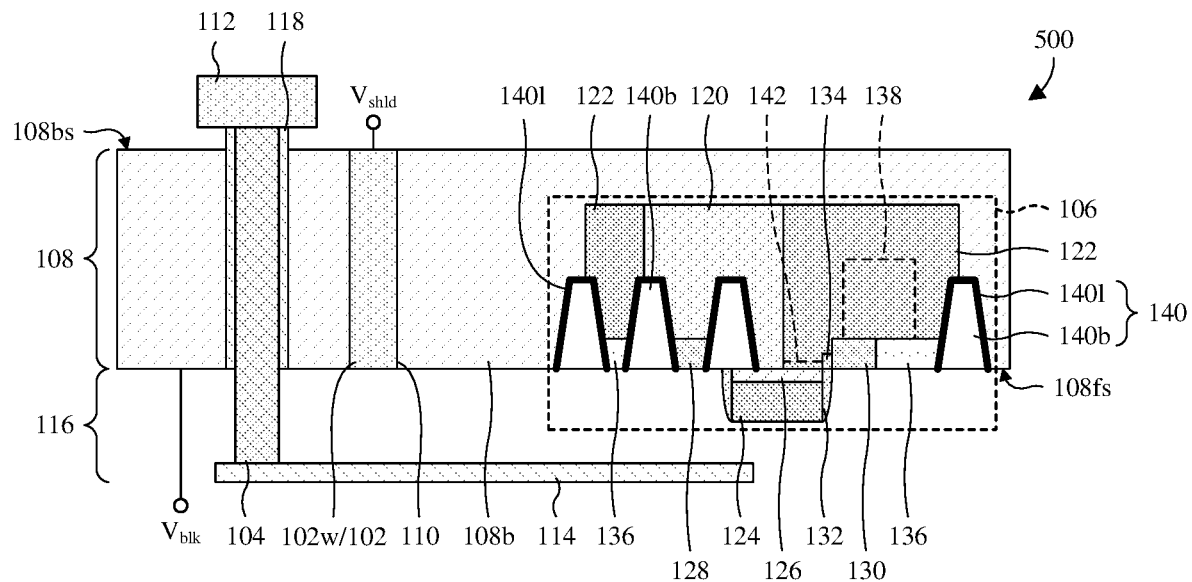
FIG. 5 illustrates a cross-sectional view of some alternative embodiments of the IC of FIGS. 1A and 1B in which the single shield well extends in an open path around the TSV.

With reference to FIG. 5, a cross-sectional view 500 of some alternative embodiments of the IC of FIGS. 1A and 1B is provided in which the single shield well 102w extends laterally in an open path around the TSV 104 to separate the TSV 104 from the semiconductor device 106. As such, the single shield well 102w is at a side of the TSV 104 at which the semiconductor device 106 is located but is omitted from at least one other side of the TSV 104. In some embodiments, where other semiconductor devices (not shown) neighbor the TSV 104, the single shield well 102w is also at the one or more sides at which the other semiconductor devices are located to provide shielding to the other semiconductor devices. Further, in some embodiments, the single shield well 102w is omitted from one or more sides of the TSV 104 at which no semiconductor devices are located since shielding may not be needed. For example, no semiconductor devices may be at an opposite side of the TSV 104 as the semiconductor device 106 and the single shield well 102w may be omitted from this side.

By omitting the single shield well 102w from at least one side of the TSV 104, the area occupied by the single shield well 102w is reduced. This, in turn, leaves more room for other structures and/or semiconductor devices.

Figure 6A:
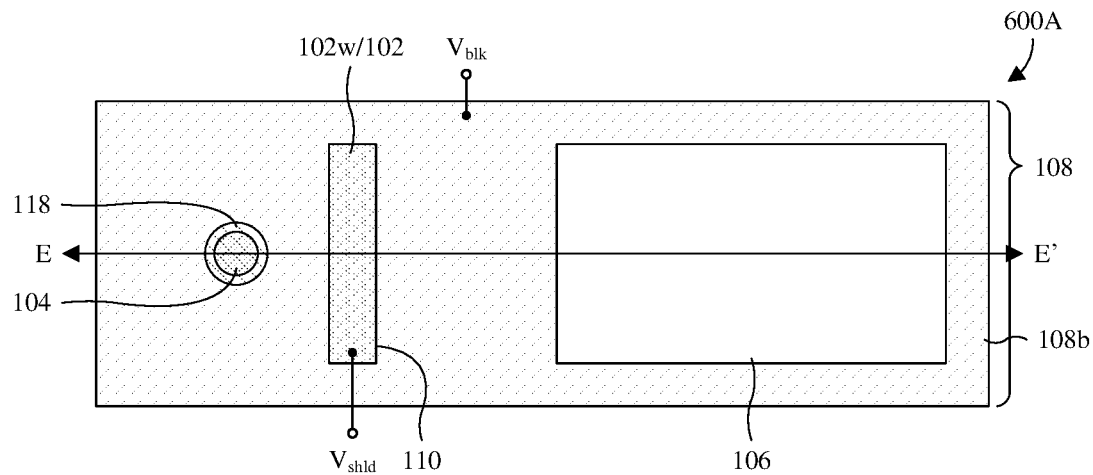
FIGS. 6A-6C illustrate top views of some embodiments of the IC of FIG. 5.
Figure 6B:
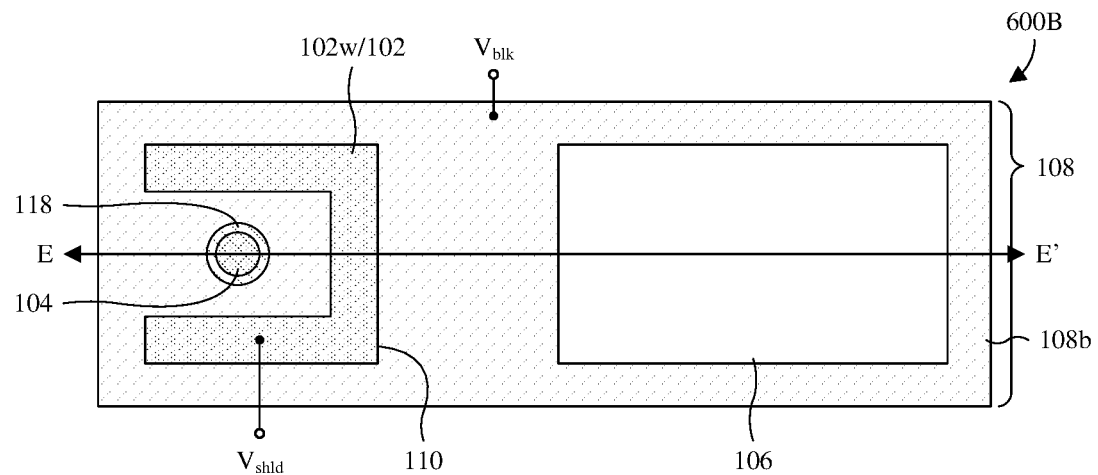
Figure 6C:
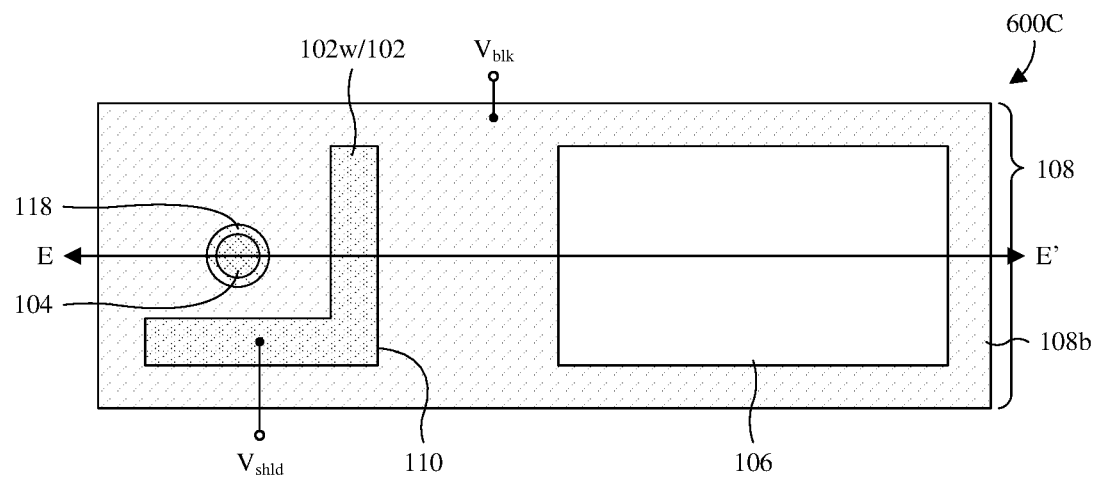

With reference to FIGS. 6A-6C, various top views 600A-600C of some embodiments of the IC of the FIG. 5 are provided. The cross-sectional view 500 of FIG. 5 may, for example, be taken along line E-E' in the top views 600A-600C of FIGS. 6A-6C. FIG. 6A illustrates embodiments of the shield well 102w in which the shield well 102w is line shaped and localized to a single side of the TSV 104. FIG. 6B illustrates embodiments of the shield well 102w in which the shield well 102w has a reversed C shape. FIG. 6C illustrates embodiments of the shield well 102w in which the shield well 102w has a reversed L shape. Other shapes for the shield well 102w are, however, amenable in alternative embodiments. In some embodiments, no semiconductor devices are on an opposite side of the TSV 104 as the semiconductor device 106 and/or are on sides of the TSV 104 where the shield well 102w is omitted.

While FIGS. 5 and 6A-6C are described with a single shield well separating the TSV 104 from the semiconductor device 106, multiple shield wells may separate the TSV 104 from the semiconductor device 106 in alternative embodiments. Each of said multiple shield wells may, for example, be as the shield well 102w is illustrated and/or described in any one or combination of FIGS. 5 and 6A-6B.

Figure 7A:
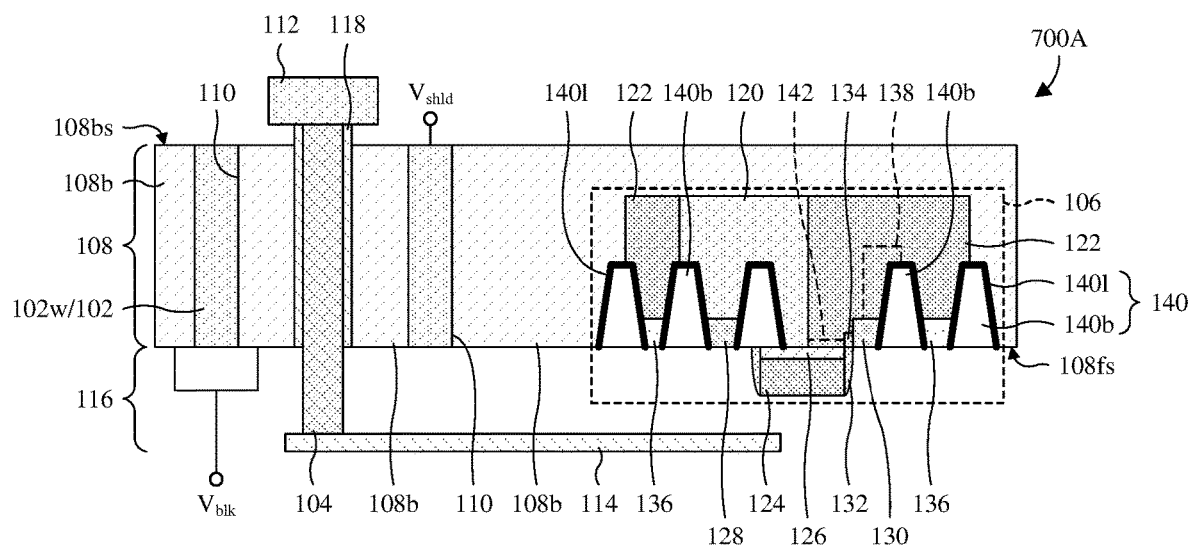
FIGS. 7A-7F illustrate cross-sectional views of some alternative embodiments of the IC of FIGS. 1A and 1B in which the semiconductor device is varied

With reference to FIG. 7A, a cross-sectional view 700A of some alternative embodiments of the IC of FIG. 1A is provided in which the trench isolation structure 140 further separates the second source/drain region 130 from a neighboring one of the second device-well contact regions 136. The semiconductor device 106 may, for example, be an asymmetric N-channel HVMOS or some other suitable semiconductor device.

Figure 7B:
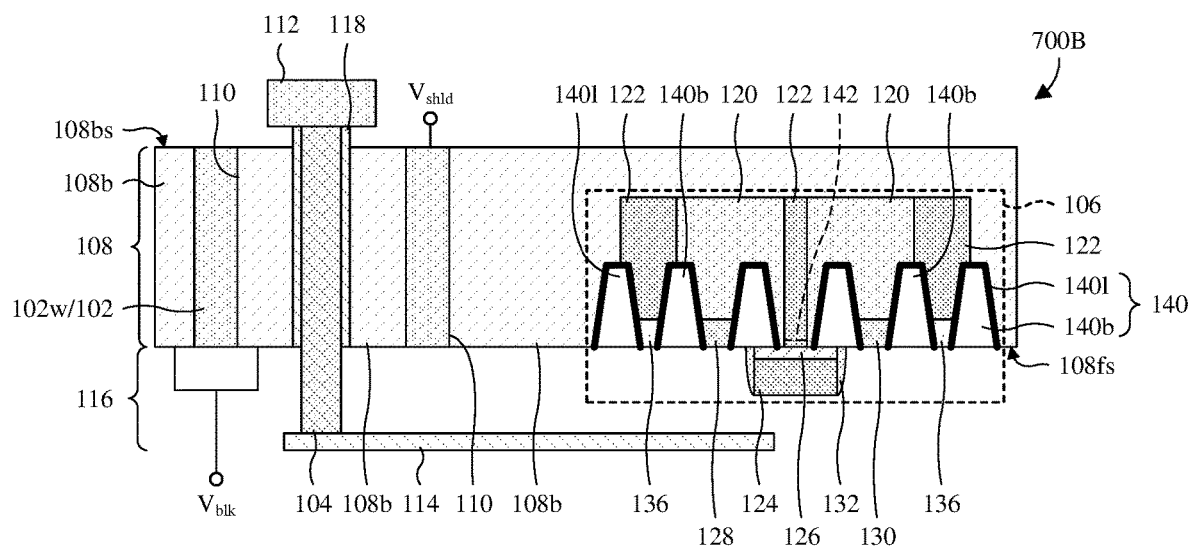

With reference to FIG. 7B, a cross-sectional view 700B of some alternative embodiments of the IC of FIG. 7A is provided in which the second device well 122 separates the first device well 120 into two segments upon which the first and second source/drain regions 128, 130 are respectively on. The two segments of the first device well 120 act as resistors extending to the channel region 142 respectively from the first and second source/drain regions 128, 130. This decreases the voltage across the channel region 142 and allows the semiconductor device 106 to operate at higher voltages than it would otherwise be able to. Additionally, the isolation well 138 and the source/drain extension 134 are omitted and the semiconductor device 106 is symmetrical about a vertical axis evenly spaced between the two segments of the first device well 120. The semiconductor device 106 may, for example, be a symmetric N-channel HVMOS or some other suitable semiconductor device.

Figure 7C:
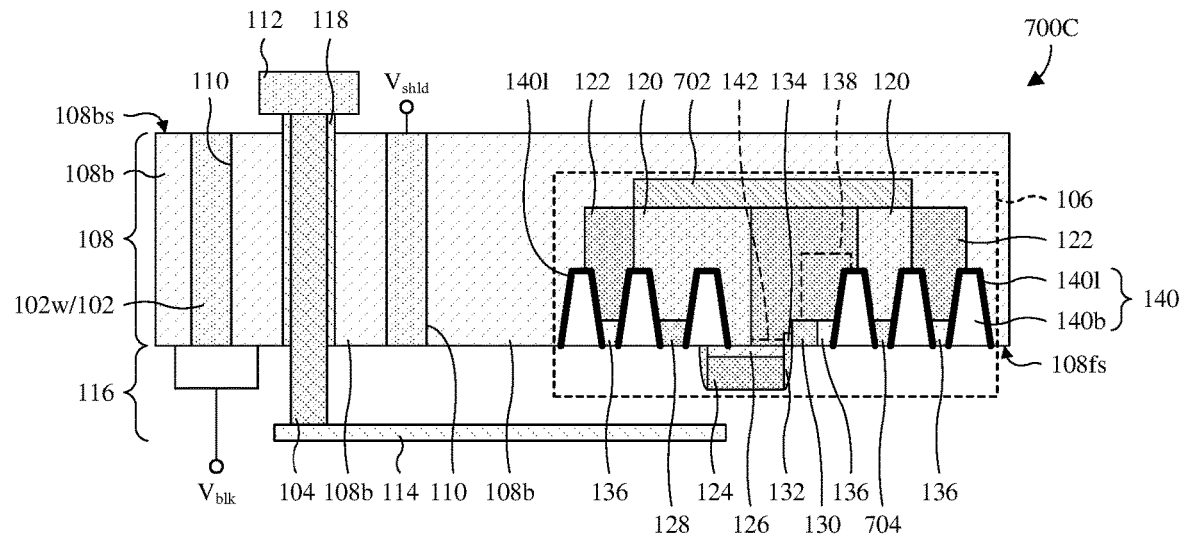

With reference to FIG. 7C, a cross-sectional view 700C of some alternative embodiments of the IC of FIG. 1A is provided in which a deep well 702 overlies the first device well 120. Further, the second device well 122 separates the first device well 120 into two segments respectively on opposite sides of the gate electrode 124, and the deep well 702 extends laterally from a first segment of the first device well 120 to a second segment of the second device well 122. The deep well 702 has a same doping type as the first device well 120 and, in some embodiments, has a different doping concentration than the first device well 120. The deep well 702 and the first device well 120 (which share a first doping type) form a PN junction with the second device well 122 and the bulk region 108b of the substrate 108 (which share a second doping type). The PN junction has an inverted U-shaped profile or some other suitable profile and a depletion region at the PN junction provides isolation between the channel region 142 of the semiconductor device 106 and the bulk region 108b of the substrate 108.

The first source/drain region 128 is on the first segment of the first device well 120, and a first device-well contact region 704 is on the second segment of the first device well 120. Further, the trench isolation structure 140 separates the first device-well contact region 704 from neighboring second device-well contact regions 136. The first device-well contact region 704 is a doped region of the substrate 108 having a same doping type as, but a high concentration than, the first device well 120. The semiconductor device 106 may, for example, be an isolated N-channel HVMOS or some other suitable semiconductor device.

Figure 7D:
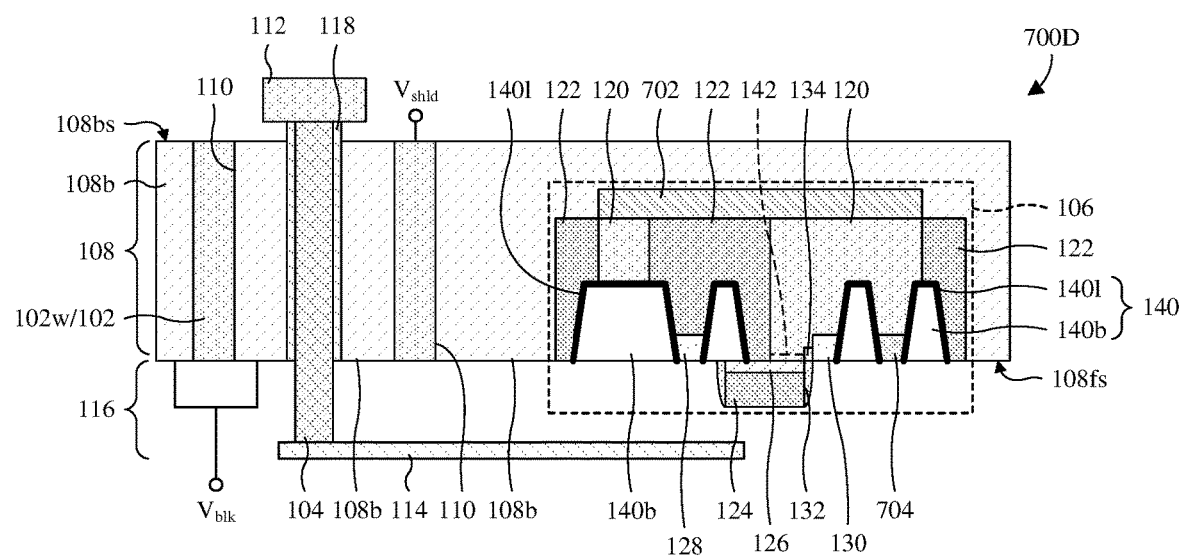

With reference to FIG. 7D, a cross-sectional view 700D of some alternative embodiments of the IC of FIG. 7C is provided in which the channel region 142 of the semiconductor device 106 is in the first device well 120 instead of the second device well 122. Further, the first and second source/drain regions 128, 130 have an opposite doping type as the first device well 120, instead of an opposite doping as the second device well 122, and the second device-well contact regions 136 are omitted. The semiconductor device 106 may, for example, be an asymmetric P-channel HVMOS or some other suitable semiconductor device.

Figure 7E:
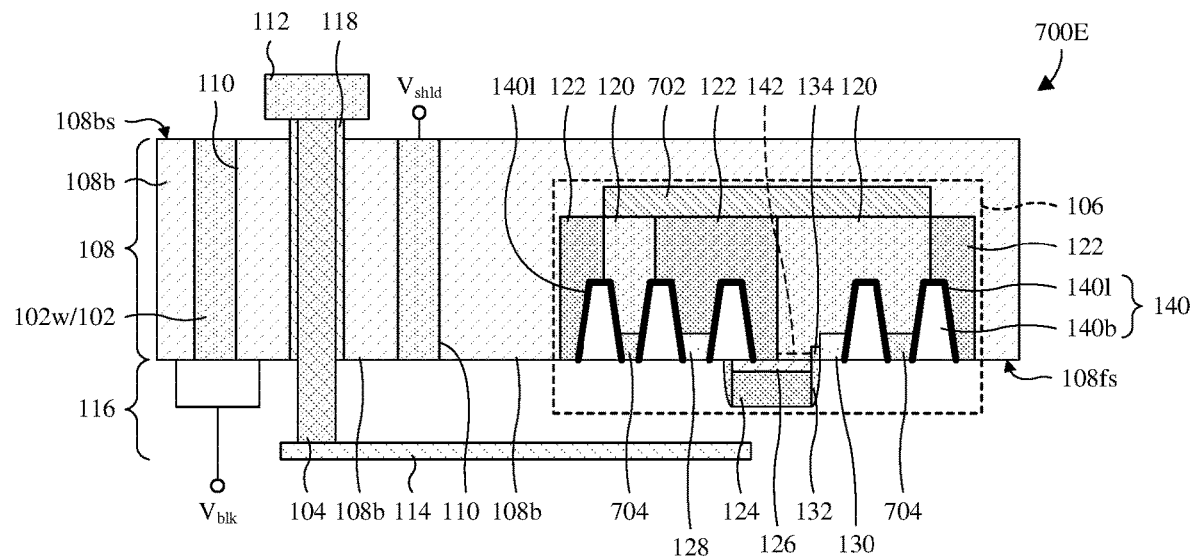

With reference to FIG. 7E, a cross-sectional view 700E of some alternative embodiments of the IC of FIG. 7D is provided in which first device-well contact regions 704 are respectively on opposite sides of the semiconductor device 106. The first device-well contact regions 704 are each as the first device-well contact region 704 of FIG. 7D is described. Further, in some embodiments, the first device-well contact regions 704 are part of a guard ring structure extending laterally along a periphery of the semiconductor device 106 when viewed top down. The semiconductor device 106 may, for example, be an asymmetric P-channel HVMOS or some other suitable semiconductor device.

Figure 7F:
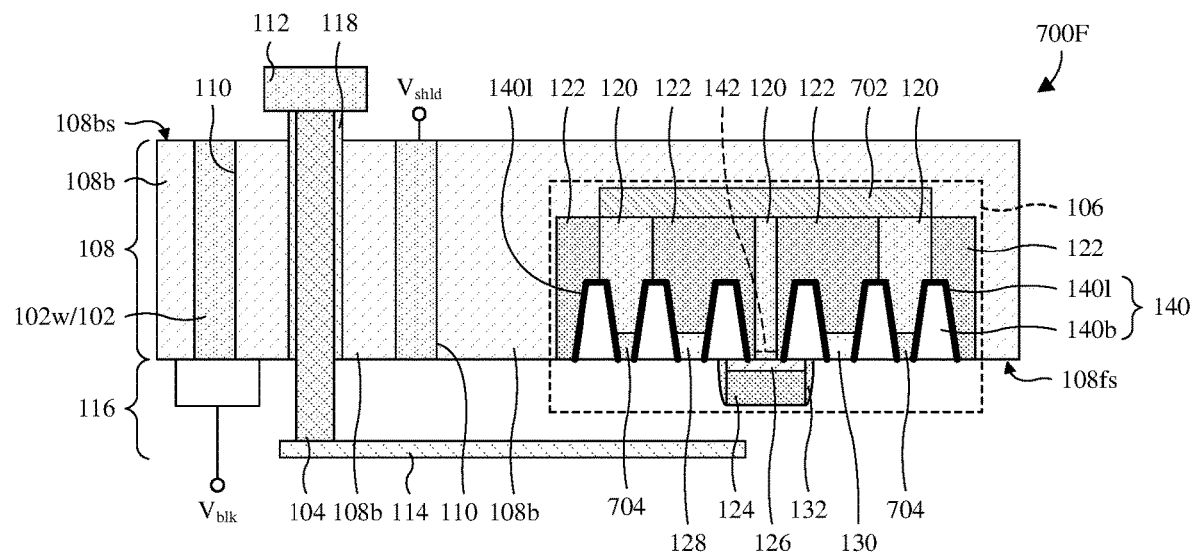

With reference to FIG. 7F, a cross-sectional view 700F of some alternative embodiments of the IC of FIG. 7E is provided in which the semiconductor device 106 is symmetrical about a vertical axis at a width-wise center of the gate electrode 124. Further, the first and second source/drain regions 128, 130 are in two segments of the second device well 122 that are separated by the first device well 120. The two segments of the second device well 122 act as resistors extending to the channel region 142 respectively from the first and second source/drain regions 128, 130. This decreases the voltage across the channel region 142 and allows the semiconductor device 106 to operate at higher voltages than it would otherwise be able to. The semiconductor device 106 may, for example, be a symmetric P-channel HVMOS or some other suitable semiconductor device.

Figure 8A:
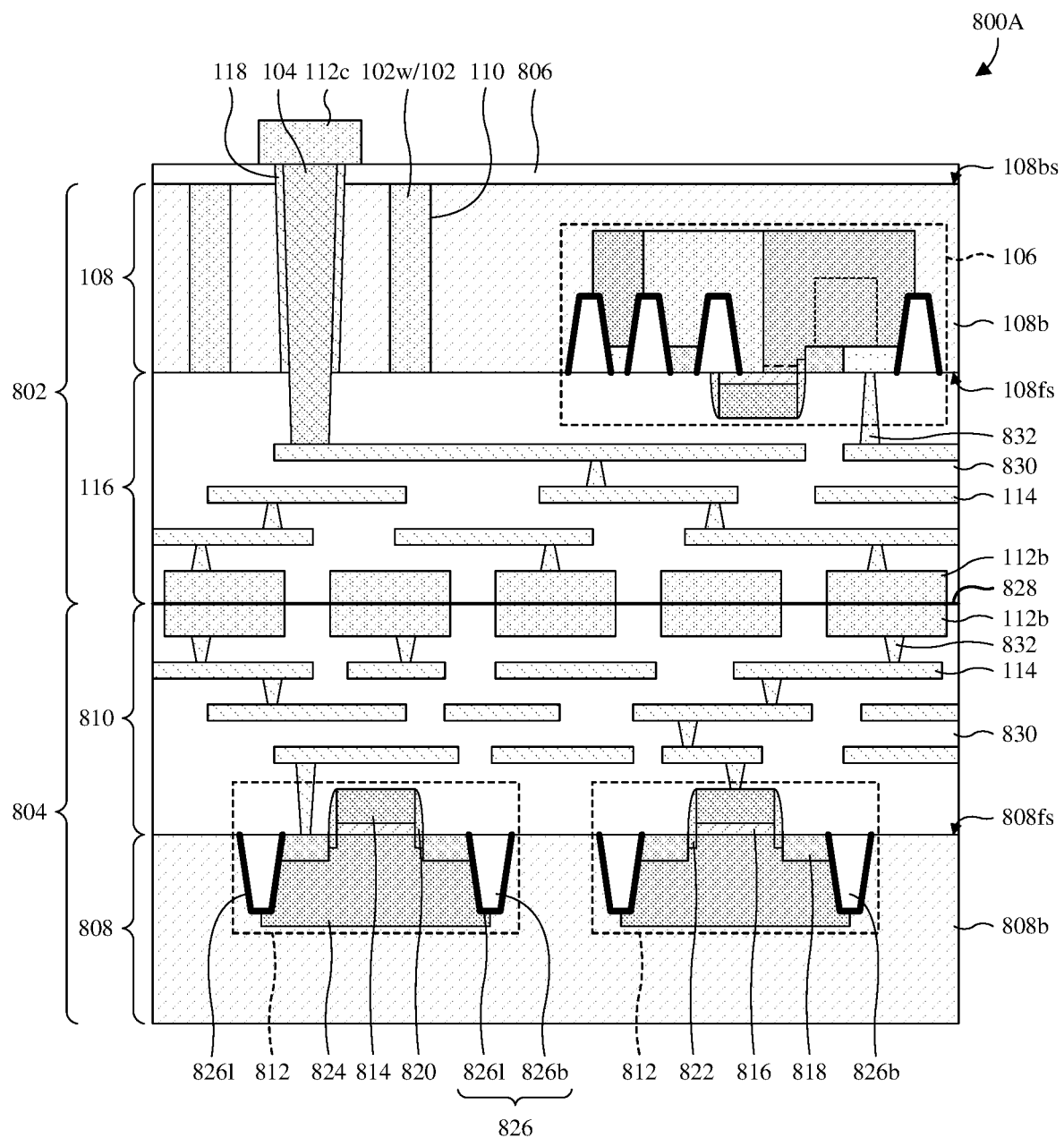
FIGS. 8A-8C illustrate cross-sectional views of various embodiments of a three-dimensional integrated circuit (3D IC) in which the shield structure of FIGS. 1A and 1B separates a TSV from a semiconductor device.

With reference to FIG. 8A, a cross-sectional view 800A of some embodiments of a three-dimensional integrated circuit (3D IC) is provided in which a shield structure 102 separates a TSV 104 from a first semiconductor device 106. The shield structure 102, the TSV 104, and the first semiconductor device 106 are in a first IC chip 802 and are as described in FIGS. 1A and 1B. The first IC chip 802 overlies and is bonded to a second IC chip 804. Further, the first IC chip 802 comprises a first substrate 108 and a first interconnect structure 116 underlying the first substrate 108 on a frontside 108fs of the first substrate 108.

The first semiconductor device 106 is on the frontside 108fs of the first substrate 108, between the first interconnect structure 116 and the first substrate 108. The TSV 104 extends through the first substrate 108 from a contact pad 112c on a backside 108bs of the first substrate 108 to the interconnect structure 116 on the frontside 108fs of the first substrate 108. Further, the TSV 104 is separated from the first substrate 108 by a TSV dielectric layer 118. In some embodiments, the contact pad 112c is separated from the first substrate 108 by a backside dielectric layer 806. The shield structure 102 comprises a shield well 102w surrounding the TSV 104 and separating the TSV 104 from the first semiconductor device 106. The shield well 102w has an opposite doping type as a bulk region 108b of the first substrate 108 so as to form PN junctions 110 with the bulk region 108b. The PN junctions 110 result in depletion regions that block the migration of charge from proximate the TSV 104 to the first semiconductor device 106. As noted above, the charge may, for example, be introduced into the first substrate 108 during plasma etching used to form of the TSV 104.

The second IC chip 804 comprises a second substrate 808 and a second interconnect structure 810 overlying the second substrate 808 on a frontside 808fs of the second substrate 808. The second substrate 808 may be, for example, a bulk monocrystalline silicon substrate or some other suitable semiconductor substrate. A plurality of second semiconductor devices 812 is on the frontside 808fs of the second substrate 808, between the second interconnect structure 810 and the second substrate 808. The second semiconductor devices 812 may, for example, be MOSFETs and/or some other suitable semiconductor devices. Further, the second semiconductor devices 812 may, for example, be limited to lower operating voltages compared to the first semiconductor device 106.

The second semiconductor devices 812 comprise individual gate electrodes 814 and individual gate dielectric layers 816 separating the gate electrodes 814 from the second substrate 808. Further, the second semiconductor devices 812 comprise individual pairs of source/drain regions 818 having opposite doping types as adjoining regions of the second substrate 808. The gate electrodes 814 are each laterally sandwiched between the source/drain regions 818 of a corresponding one of the pairs. In some embodiments, dielectric spacers 820 are on sidewalls of the gate electrodes 814 and source/drain region extensions 822 extend respectively under the dielectric spacers 820 respectively from the source/drain regions 818. The source/drain region extensions 822 have the same doping type, but lower doping concentrations, than the source/drain regions 818. In some embodiments, the second semiconductor devices 812 are on individual wells 824 of the second substrate 808. The wells 824 each have an opposite doping type and/or a different doping concentration than a bulk region 808b of the second substrate 808. In other embodiments, one or more of the wells 824 is/are omitted.

A plurality of trench isolation structures 826 separate the second semiconductor devices 812 from each other. The trench isolation structures 826 comprise individual trench isolation bodies 826b and individual trench isolation liner 826l separating the trench isolation bodies 826b from the second substrate 808. The trench isolation bodies 826b and the trench isolation liners 826l are or comprise different dielectric materials.

The first and second interconnect structures 116, 810 are hybrid bonded together at a bond interface 828 between the first and second substrates 108, 808. In alternative embodiments, some other type of bonding is employed. The first and second interconnect structures 116, 810 comprise individual frontside dielectric layers 830, and further comprises a plurality of wires 114, a plurality of vias 832, and a plurality of bond pads 112b stacked in the frontside dielectric layers 830. The bond pads 112b are bonded together at the bond interface 828, and the wires 114 and the vias 832 are alternatingly stacked to define conductive paths leading from the bond pads 112b and/or from the first and second semiconductor devices 106, 812.

Figure 8B:
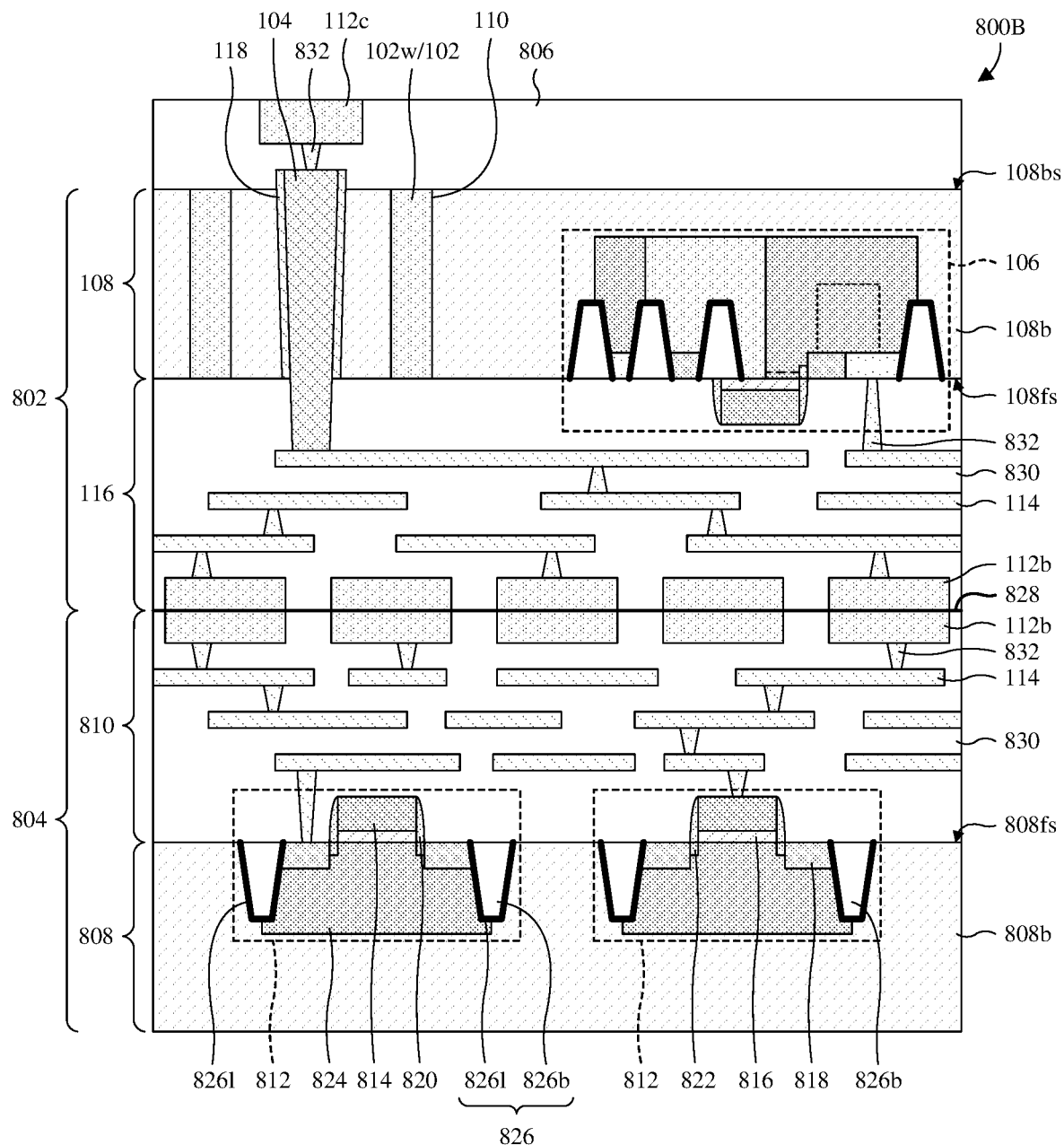

With reference to FIG. 8B, a cross-sectional view 800B of some alternative embodiments of the 3D IC of FIG. 8A is provided in which the contact pad 112c is separated from the TSV 104 by a via 832. Further, the contact pad 112c is recessed into the backside dielectric layer 806. The via 832 may, for example, be the same as its counterparts in the first and second interconnect structures 116, 810 are described.

Figure 8C:
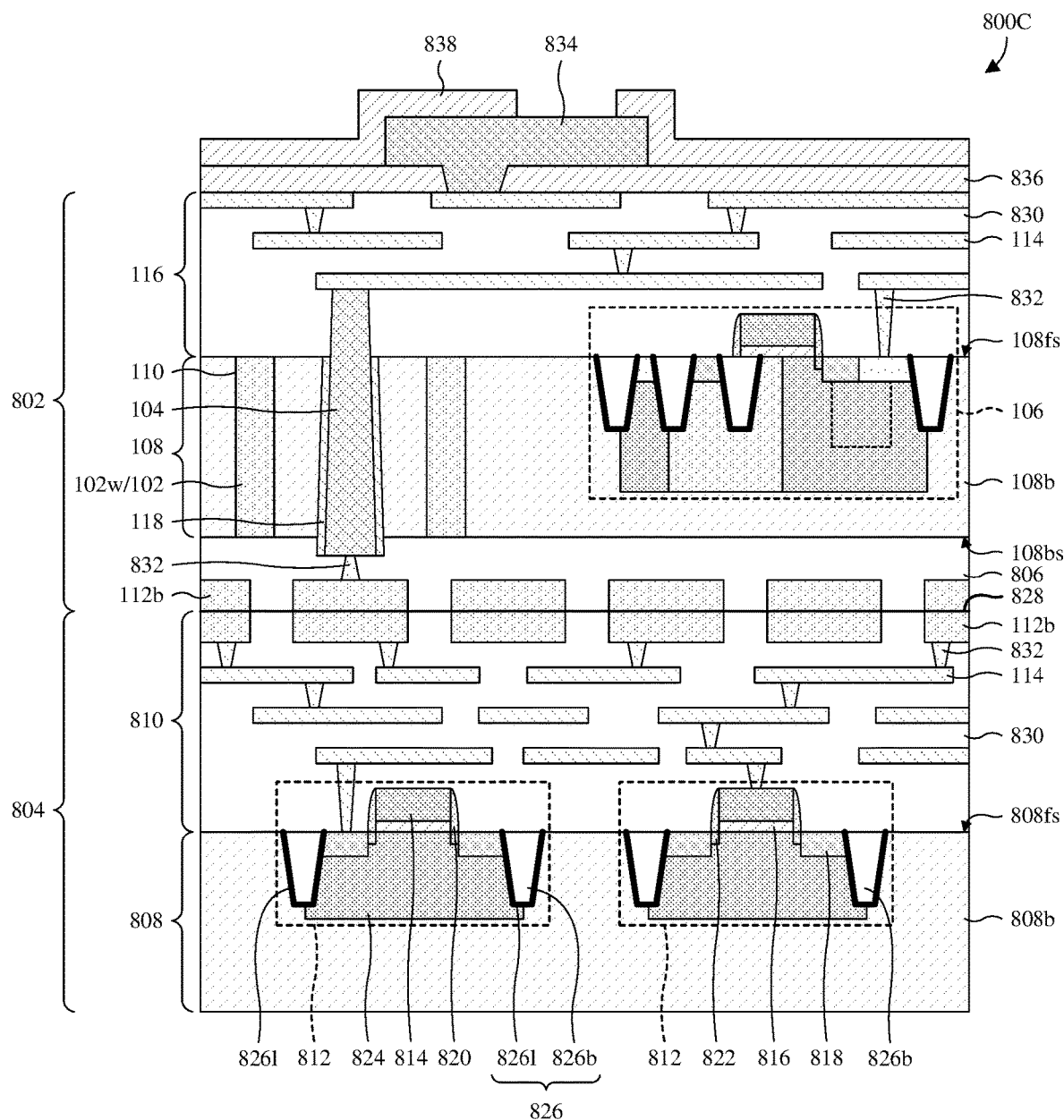

With reference to FIG. 8C, a cross-sectional view 800C of some alternative embodiments of the 3D IC of FIG. 8B is provided in which the backside 108bs of the first substrate 108 is bonded to the frontside 808fs of the second substrate 808. Further, a pad structure 834 overlies and electronically couples to the first interconnect structure 116. A first passivation layer 836 is between the pad structure 834 and the first interconnect structure 116, and the pad structure 834 protrudes through the first passivation layer 836 to the first interconnect structure 116. A second passivation layer 838 lines sidewalls of and partially covers the pad structure 834. The pad structure 834 may be or comprise aluminum and/or some other suitable metal(s). The first and second passivation layers 836, 838 may be or comprise silicon oxide, silicon nitride, some other suitable dielectric(s), or any combination of the foregoing.

While the shield structure 102 in FIGS. 8A-8C is configured according to embodiments in FIGS. 1A and 1B, the shield structure 102 may alternatively be configured according embodiments in any one of FIGS. 2A and 2B, FIGS. 3A and 3B, FIGS. 4A and 4B, FIG. 5, FIGS. 6A-6C. Similarly, while the first semiconductor device 106 in FIGS. 8A-8C is configured according to embodiments of the semiconductor device 106 in FIGS. 1A and 1B, the first semiconductor device 106 may be alternatively be configured according to embodiments of the semiconductor device 106 in any one of FIGS. 7A-7F.

With reference to FIGS. 9-19, a series of cross-sectional views 900-1900 of some embodiments of a method for forming a 3D IC is provided in which a shield structure 102 separates a TSV 104 from a semiconductor device 106. The 3D IC being formed may, for example, correspond to the 3D IC of FIG. 8A.

Figure 9:
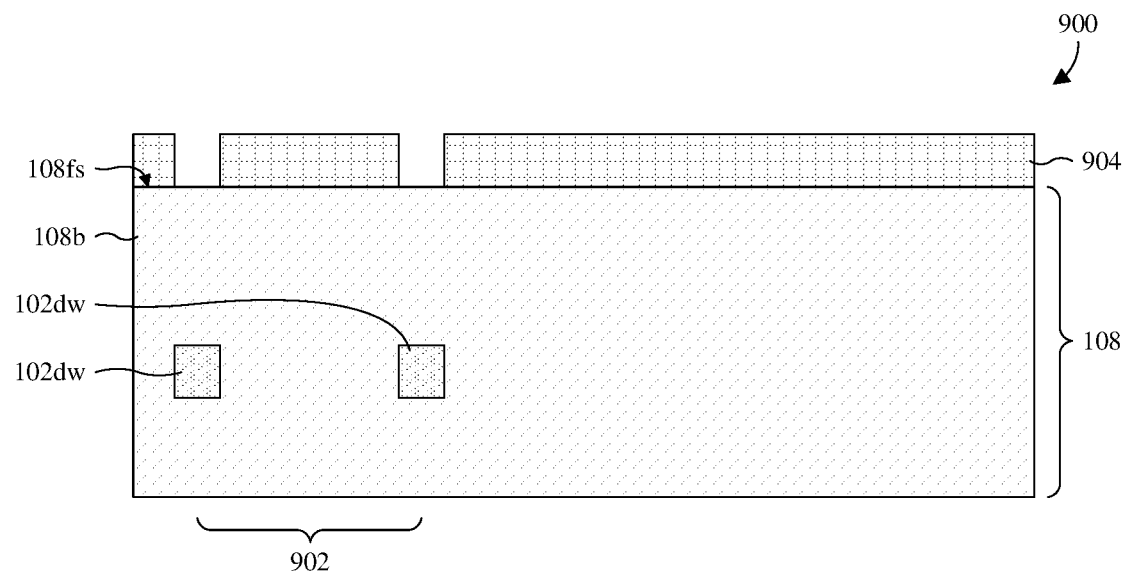
FIGS. 9-19 illustrate a series of cross-sectional views of some embodiments of a method for forming a 3D IC in which a shield structure separates a TSV from a semiconductor device.

As illustrated by the cross-sectional view 900 of FIG. 9, a first substrate 108 is doped from a frontside 108fs of the first substrate 108 to form a deep shield well 102dw extending laterally (when viewed top down) to demarcate a TSV region 902 of the first substrate 108. The deep shield well 102dw may, for example, have a same top layout as the shield well 102w in FIG. 1B or some other suitable top layout. The deep shield well 102dw is buried in the first substrate 108 and is a doped region of the first substrate 108 having an opposite doping type as a bulk region 108b of the first substrate 108. For example, the deep shield well 102dw may be N-type and the bulk region 108b may be P-type or vice versa. The first substrate 108 may, for example, be a bulk silicon substrate or some other suitable semiconductor substrate.

In some embodiments, a process for forming the deep shield well 102dw comprises: 1) forming a first mask 904 on the frontside 108fs of the first substrate 108; 2) implanting dopants into the frontside 108fs of the first substrate 108 with the first mask 904 in place; and 3) removing the first mask 904. Other processes are, however, amenable. The first mask 904 may, for example, be or comprise photoresist and/or a hard mask material.

Figure 10:
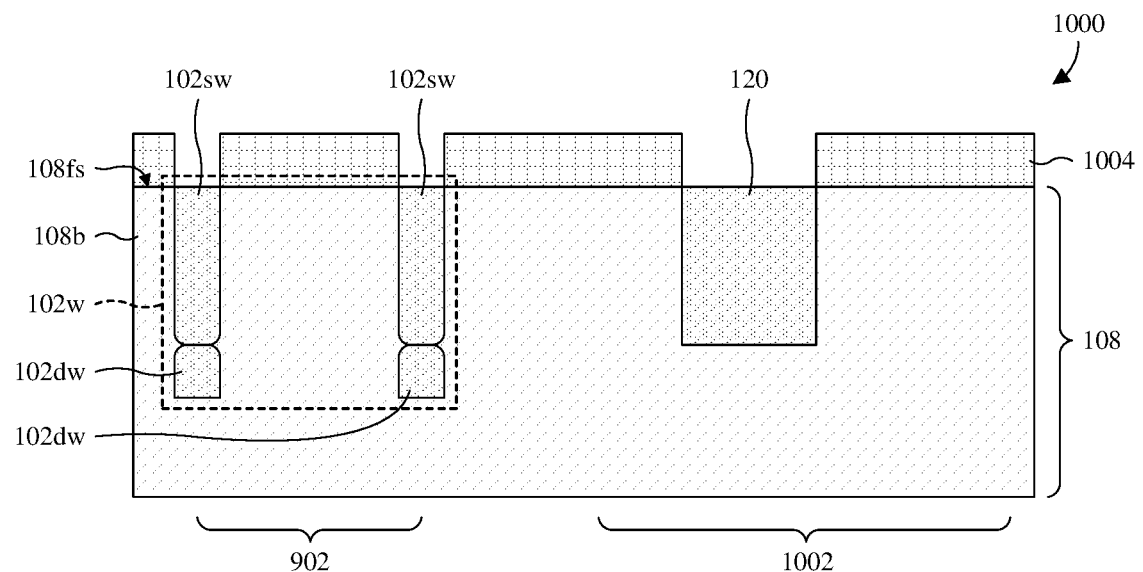

As illustrated by the cross-sectional view 1000 of FIG. 10, the first substrate 108 is doped from the frontside 108fs of the first substrate 108 to form a shallow shield well 102sw and a first device well 120 respectively at the TSV region 902 of the first substrate 108 and a device region 1002 of the first substrate 108. The shallow shield well 102sw and the first device well 120 are doped regions of the first substrate 108 having a same doping type as the deep shield well 102dw and an opposite doping type as the bulk region 108b of the first substrate 108. The shallow shield well 102sw overlaps with the deep shield well 102dw and extends laterally (when viewed top down) to further demarcate the TSV region 902. The shallow shield well 102sw may, for example, have a same top layout as the deep shield well 102dw and/or a same top layout as the shield well 102w in FIG. 1B. Other suitable top layouts are, however, amenable.

In some embodiments, a process for forming the shallow shield well 102sw and the first device well 120 comprises: 1) forming a second mask 1004 on the frontside 108fs of the first substrate 108; 2) implanting dopants into the frontside 108fs of the first substrate 108 with the second mask 1004 in place; and 3) removing the second mask 1004. Other processes are, however, amenable. The second mask 1004 may, for example, be or comprise photoresist and/or a hard mask material. In some alternative embodiments, the first mask 904 of FIG. 9 is not removed after the implanting at FIG. 9 but is instead patterned into the second mask 1004.

While FIGS. 9 and 10 illustrate the deep shield well 102dw as being formed before the shallow shield well 102sw and the first device well 120, the deep shield well 102dw may be formed after the shallow shield well 102sw and the first device well 120 in alternative embodiments. Further, while the deep shield well 102dw is illustrated as being formed, the deep shield well 102dw may not be formed in alternative embodiments. Because the deep shield well 102dw may or may not be formed, the shallow shield well 102sw and, where present, the deep shield well 102dw will hereafter (i.e., FIG. 11 onward) be referred to collectively as the shield well 102w. No distinction will hereafter be made between these shield wells.

Figure 11:
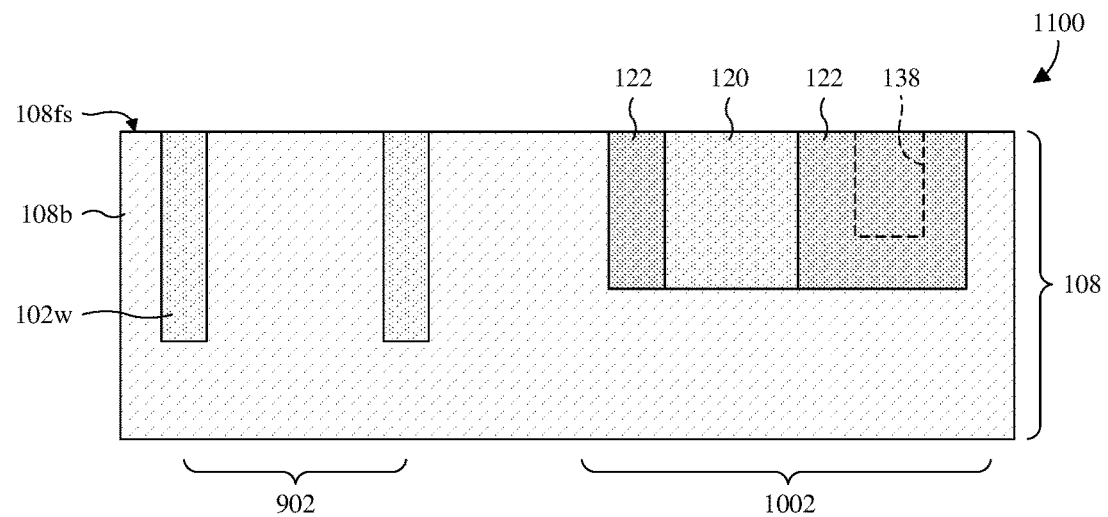

As illustrated by the cross-sectional view 1100 of FIG. 11, the first substrate 108 is doped from the frontside 108fs of the first substrate 108 to form a second device well 122 and, in some embodiments, an isolation well 138 at the device region 1002 of the first substrate 108. The second device well 122 and the isolation well 138 are doped regions of the first substrate 108 having a same doping type as the bulk region 108b of the first substrate 108 and an opposite doping type as the first device well 120. The second device well 122 is formed with a pair of segments respectively on opposite sides of the first device well 120, and the isolation well 138 is formed overlapping one of the segments. In some embodiments, the second device well 122 and the isolation well 138 are individually formed according to the process described above for the first device well 120. Other processes are, however, amenable.

Figure 12:
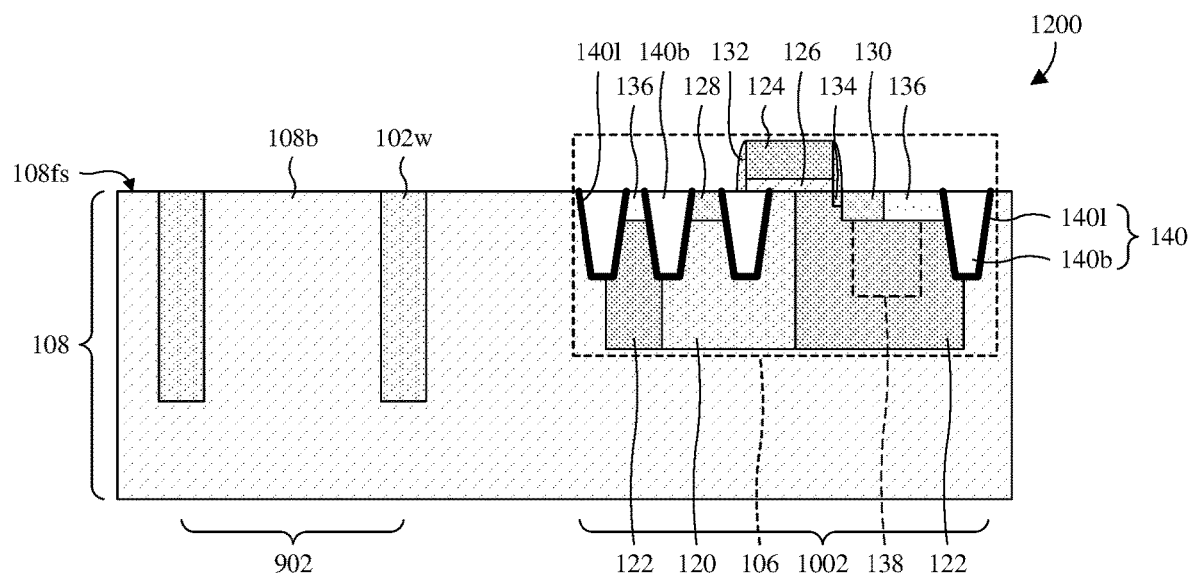

As illustrated by the cross-sectional view 1200 of FIG. 12, a first semiconductor device 106 is formed on the first and second device wells 120, 122. The first semiconductor device 106 may, for example, be as the semiconductor device 106 of FIGS. 1A and 1B is illustrated and described. In some embodiments, a process for forming the first semiconductor device 106 comprises: 1) forming a trench isolation structure 140 extending into the first substrate 108; 2) forming a gate dielectric layer 126 and a gate electrode 124 stacked upon each other; 3) forming a first source/drain region 128 and a second source/drain region 130 respectively bordering opposite sides of the gate electrode 124; and 4) forming second device-well contact regions 136 at a periphery of the semiconductor device 106. In some embodiments, the process further comprises: 1) forming a source/drain extension 134; and 2) forming a dielectric spacer 132 on sidewalls of the gate electrode 124. Other processes for forming the first semiconductor device 106 are, however, amenable.

In some embodiments, a process for forming the trench isolation structure 140 comprises: 1) patterning the frontside 108fs of the first substrate 108 to form a trench with a layout of the trench isolation structure 140; 2) depositing a first dielectric layer lining and partially filling the trench; 3) depositing a second dielectric layer filling a remainder of the trench; and 4) performing a planarization into the first and second dielectric layers to respectively form a trench isolation liner 140l and a trench isolation body 140b. Other processes for forming the trench isolation structure 140 are, however, amenable.

Figure 13:
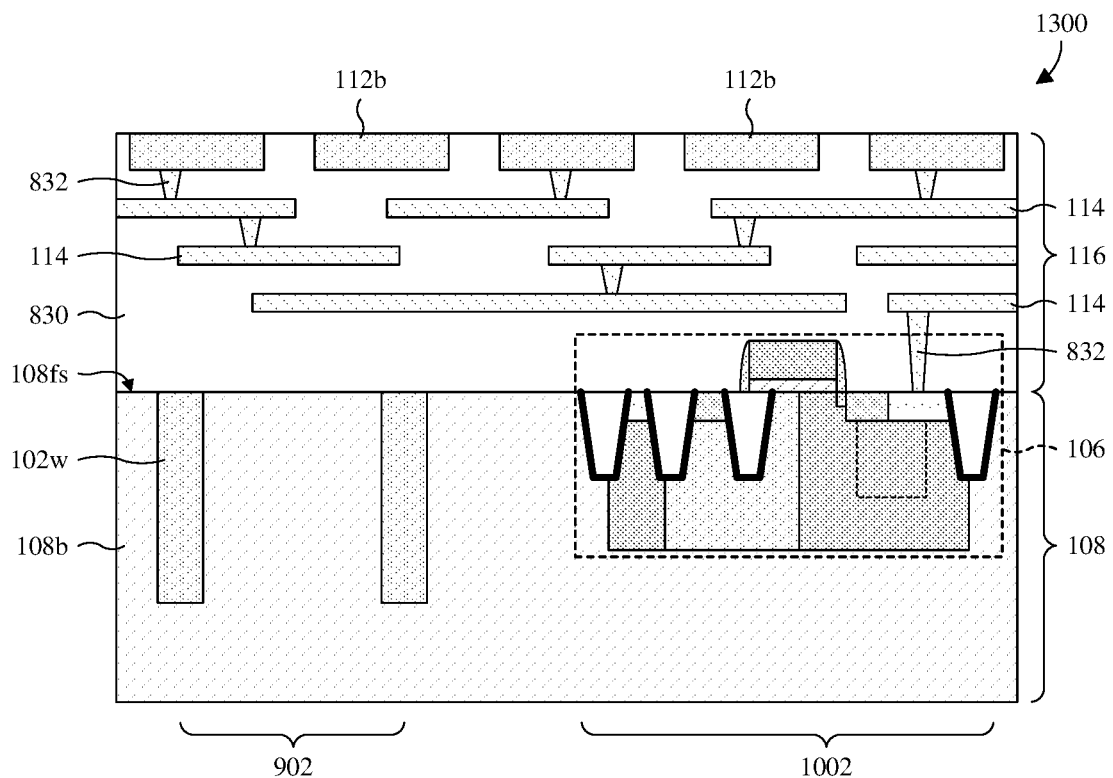

As illustrated by the cross-sectional view 1300 of FIG. 13, a first interconnect structure 116 is formed covering the shield well 102w and the first semiconductor device 106 on the frontside 108fs of the first substrate 108. The first interconnect structure 116 comprises a plurality of wires 114, a plurality of vias 832, and a plurality of bond pads 112b stacked in a frontside dielectric layers 830. The wires 114 and the vias 832 alternatingly stacked between the bond pads 112b and the first substrate 108 to define conductive paths extending from the first semiconductor device 106 and the bond pads 112b.

Figure 14:
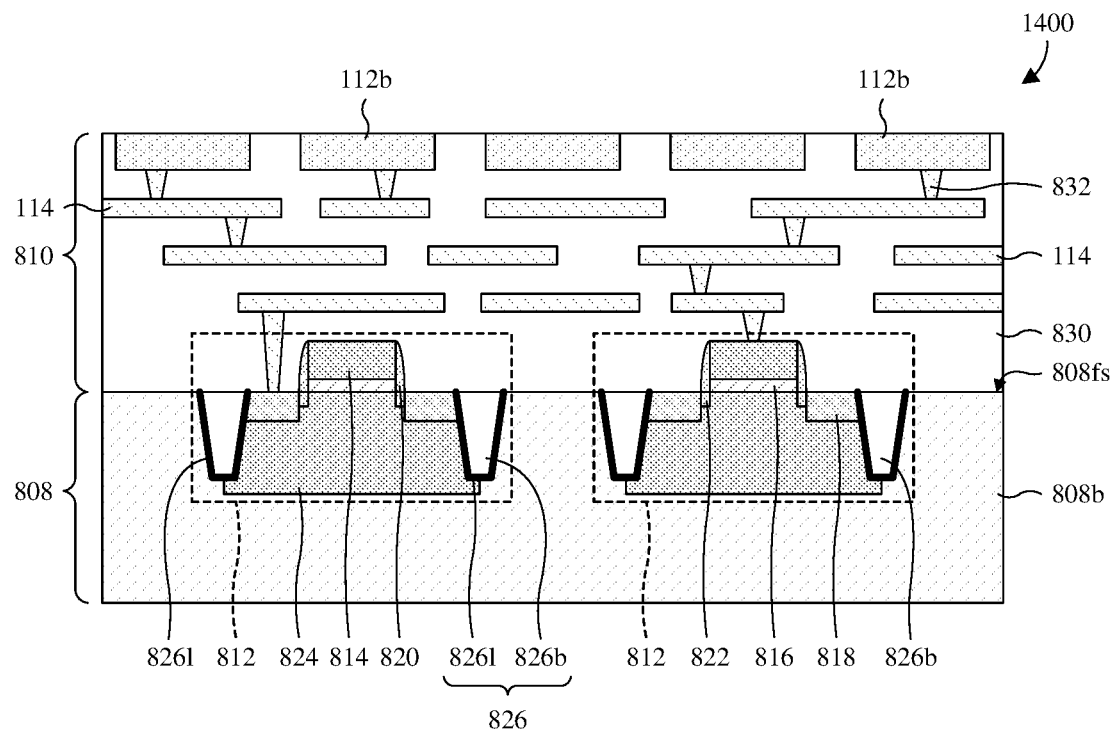

As illustrated by the cross-sectional view 1400 of FIG. 14, a plurality of second semiconductor devices 812 is formed on a frontside 808fs of a second substrate 808. The second semiconductor devices 812 may, for example, be as illustrated and described with regard to FIG. 8A. In some embodiments, a process for forming the second semiconductor devices 812 comprises: 1) forming wells 824 overlying a bulk region 808b of the second substrate 808 in the second substrate 808; 2) forming trench isolation structures 826 extending into the second substrate 808; 3) forming gate dielectric layers 816 and gate electrodes 814 stacked upon each other; and 4) forming source/drain regions 818 bordering the gate electrodes 814. In some embodiments, the process further comprises: 1) forming source/drain region extensions 822; and 2) forming dielectric spacers 820 on sidewalls of the gate electrodes 814. Other processes for forming the second semiconductor devices 812 are, however, amenable.

In some embodiments, a process for forming the trench isolation structures 826 is the same as that described with regard to FIG. 12 for the trench isolation structure 140 of FIG. 12. Other processes are, however, amenable. In some embodiments in which the trench isolation structures 826 are formed according to the process at FIG. 12, the trench isolation structures 826 comprise individual trench isolation bodies 826b and individual trench isolation liners 826l separating the trench isolation bodies 826b from the second substrate 808.

Also illustrated by the cross-sectional view 1400 of FIG. 14, a second interconnect structure 810 is formed covering the second semiconductor devices 812 on the frontside 808fs of the second substrate 808. The second interconnect structure 810 comprises a plurality of wires 114, a plurality of vias 832, and a plurality of bond pads 112b stacked in a frontside dielectric layers 830. The wires 114 and the vias 832 alternatingly stacked between the bond pads 112b and the second substrate 808 to define conductive paths extending from the second semiconductor devices 812 and the bond pads 112b.

Figure 15:
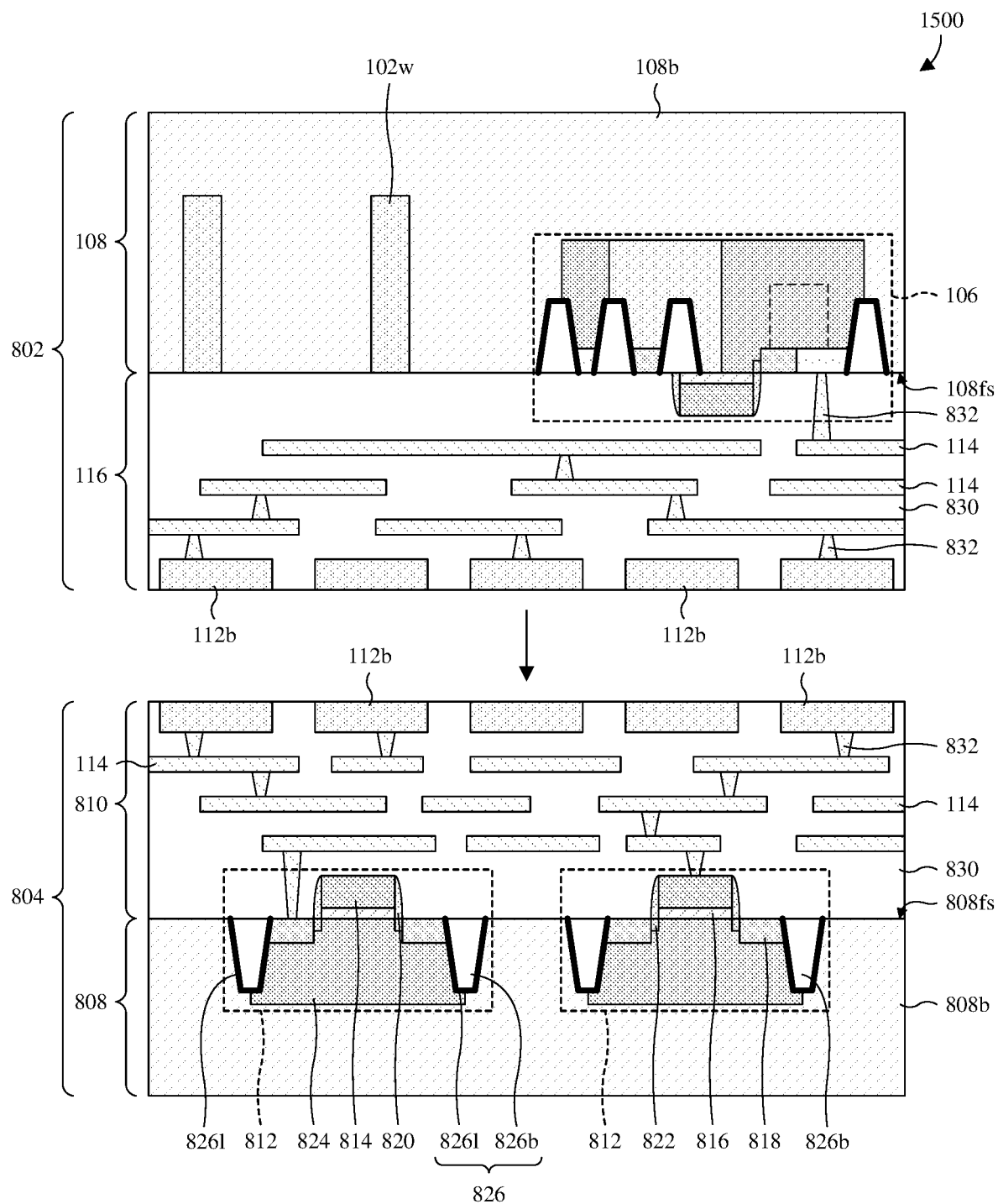

As illustrated by the cross-sectional view 1500 of FIG. 15, the structure of FIG. 13 (also known as a first IC chip 802) is flipped vertically and bonded to the structure of FIG. 14 (also known as a second IC chip 804). The bonding is performed by hybrid bonding, such that bonding occurs at an interface at which the bond pads 112b of the first and second IC chips 802, 804 directly contact and at an interface at which the frontside dielectric layers 830 of the first and second IC chips 802, 804 directly contact. In alternative embodiments, some other type of bonding and/or bond structures may be employed.

Figure 16:
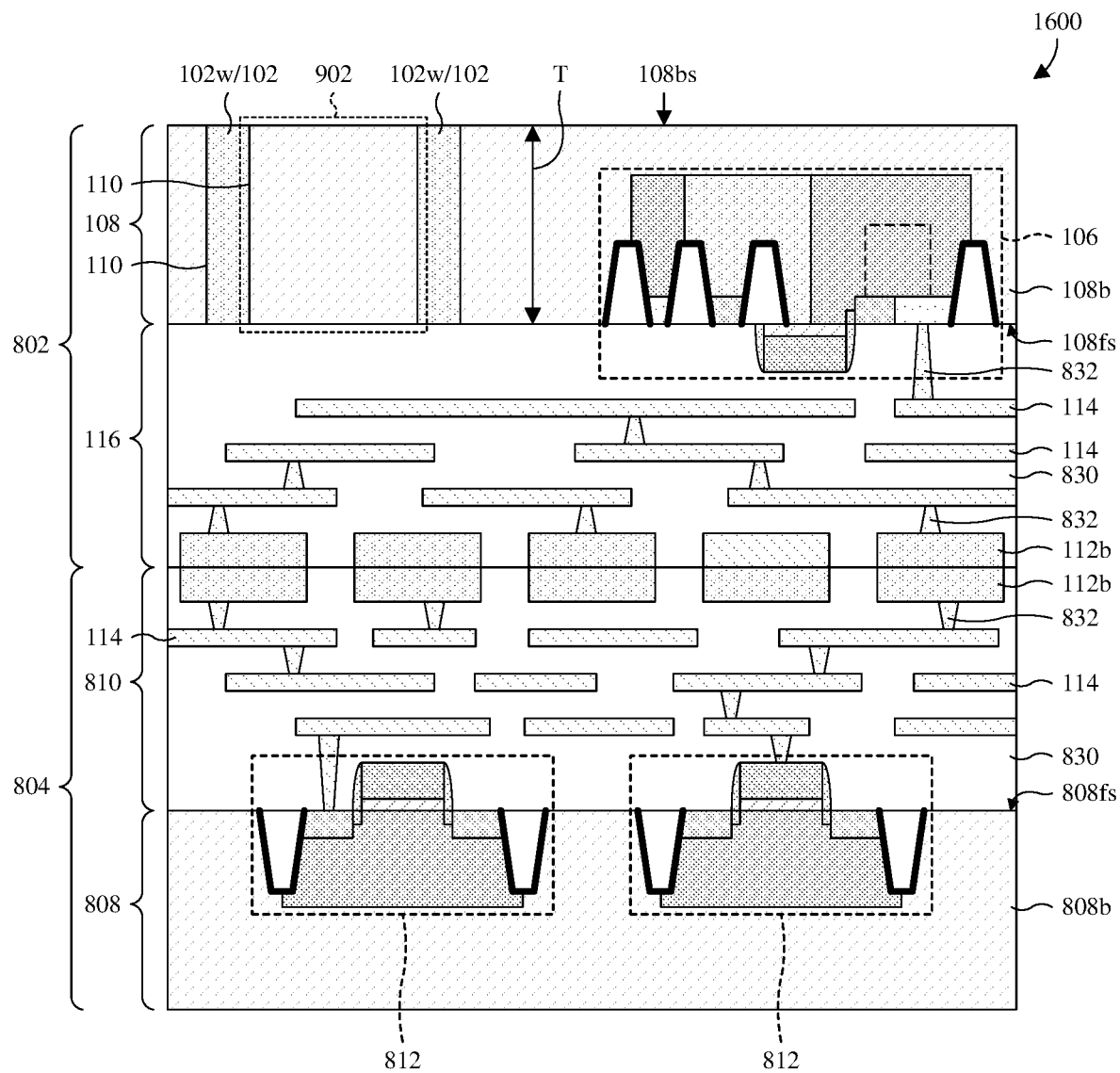

As illustrated by the cross-sectional view 1600 of FIG. 16, the first substrate 108 is thinned from a backside 108bs of the first substrate 108 to reduce a thickness T of the first substrate 108 and to expose the shield well 102w. By exposing the shield well 102w, the shield well 102w extends completely through the first substrate 108 and defines a shield structure 102 separating the TSV region 902 of the first substrate 108 from a remainder of the first substrate 108. Particularly, the shield well 102w defines PN junctions 110 with the bulk region 108b of the first substrate 108. Since the PN junctions 110 extend completely through the first substrate 108, depletion regions at the PN junctions 110 provide electrical separation between the TSV region 902 of the first substrate 108 and the remainder of the first substrate 108.

Figure 17:
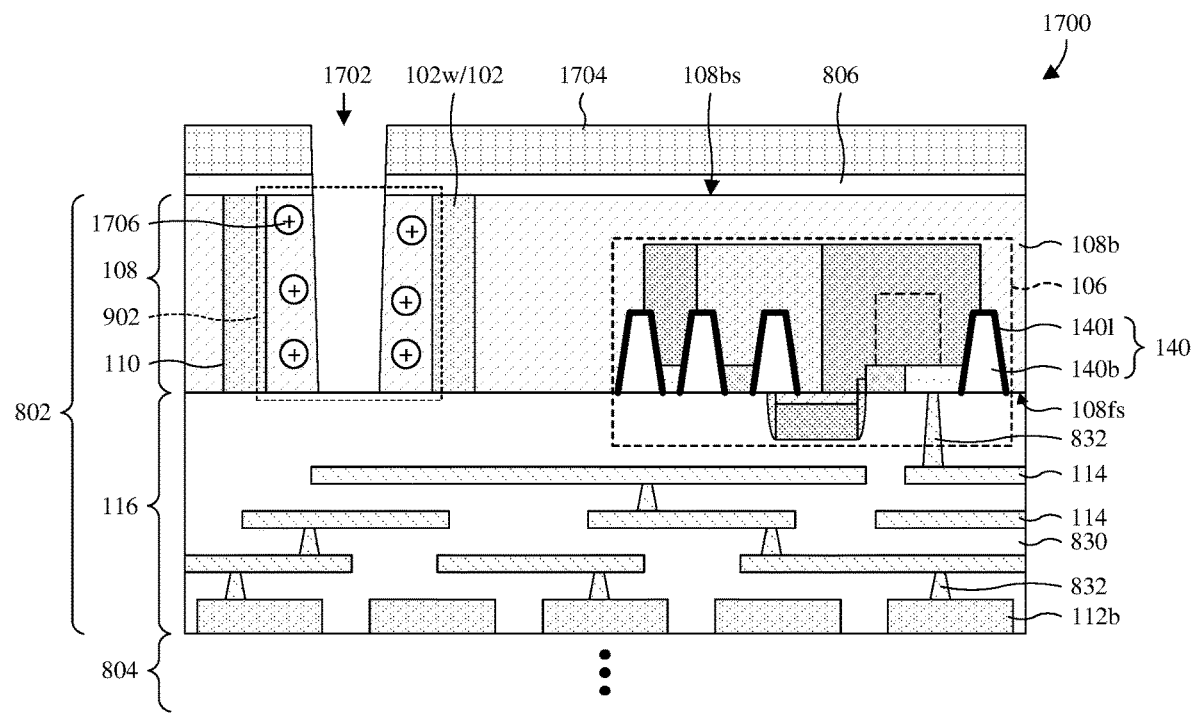

As illustrated by the cross-sectional view 1700 of FIG. 17, a backside dielectric layer 806 is formed covering the first substrate 108 on a backside 108bs of the first substrate 108. For drawing compactness, the second IC chip 804 is omitted from FIG. 17 onward and is instead replaced with an ellipsis.

Also illustrated by the cross-sectional view 1700 of FIG. 17, the backside dielectric layer 806 and the first substrate 108 are patterned from the backside 108bs of the first substrate 108 to form a TSV opening 1702 at the TSV region 902 of the first substrate 108. The TSV opening 1702 extends completely through the first substrate 108 from the backside dielectric layer 806 to the first interconnect structure 116. Further, because the TSV opening 1702 is at the TSV region 902 of the first substrate, the TSV opening 1702 is separated from the first semiconductor device 106 and other semiconductor devices (not shown) by the shield structure 102. In some embodiments, the shield structure 102 extends laterally in a closed path (when viewed top down) to completely surround the TSV opening 1702 and/or has a top layout as shown in FIG. 1B. Other top layouts are, however, amenable.

In some embodiments, the patterning comprises: 1) forming a third mask 1704 on the backside dielectric layer 806; 2) performing an etch into the backside dielectric layer 806 and the first substrate 108 with the third mask 1704 in place; and 3) removing the third mask 1704. Other processes are, however, amenable. The third mask 1704 may, for example, be or comprise photoresist and/or a hard mask material. In some embodiments, the etch is a plasma etch due to a high aspect ratio (i.e., a high ratio of height to width) of the TSV opening 1702 and/or because plasma etching may form the TSV opening 1702 with a highly anisotropic etch profile. In at least embodiments in which the etch is performed by plasma etching, the etch introduces charge 1706 into the TSV region 902 of the first substrate 108. The charge 1706 may, for example, be positive charge and/or may, for example, be carried on free radicals.

As noted above, the shield well 102w defines PN junctions 110 with the bulk region 108b of the first substrate 108 and hence depletion regions form at the shield well 102w. By separating the TSV region 902 of the first substrate 108 from the first semiconductor device 106 with the shield structure 102, the migration of the charge 1706 to the first semiconductor device 106 is blocked by the depletion regions. Further, electric fields at the depletion regions sweep charge at the first semiconductor device 106 away from the first semiconductor device 106.

Absent the shield structure 102, the charge 1706 could migrate to the first semiconductor device 106 and accumulate at the first semiconductor device 106 in the trench isolation structure 140. The charge 1706 may, for example, accumulate in the trench isolation structure 140 due to trapping by the trench isolation liner 140*l*. If the charge 1706 were to accumulate in the trench isolation structure 140, the charge 1706 could attract charge carriers of opposite polarity and shift the saturation current $I_{sat}$ of the first semiconductor device 106 and/or other operating parameter(s) of the first semiconductor device 106 out of specification. Hence, by preventing or otherwise reducing the accumulation of charge at the trench isolation structure 140, the shield structure 102 may, for example, prevent operating parameters of the first semiconductor device 106 from being shifted out of specification.

Figure 18:
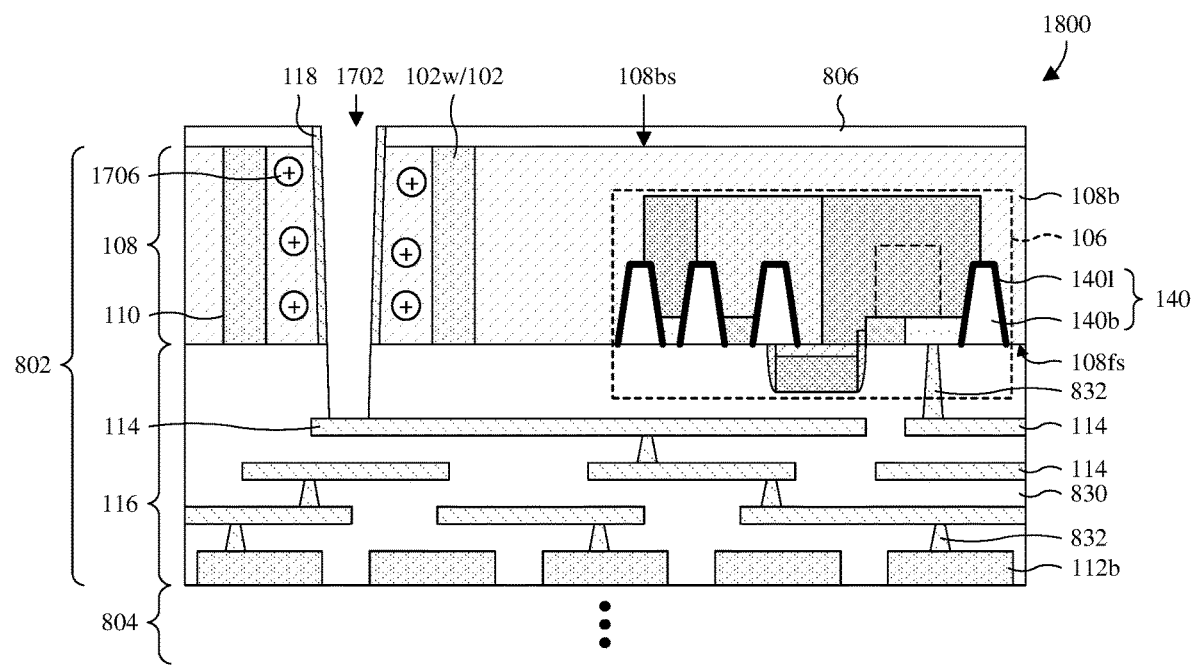

As illustrated by the cross-sectional view 1800 of FIG. 18, a TSV dielectric layer 118 is formed lining sidewalls of the TSV opening 1702. In some embodiments, a process for forming the TSV dielectric layer 118 comprises: 1) depositing the TSV dielectric layer 118 covering the backside dielectric layer 806 and conformally lining the TSV opening 1702; and 2) performing an etch back into the TSV dielectric layer 118 to remove lateral segments, but not vertical segments, of the TSV dielectric layer 118. Other processes are, however, amenable.

Also illustrated by the cross-sectional view 1800 of FIG. 18, an etch is performed into the frontside dielectric layer 830 of the first interconnect structure 116 to extend the TSV opening 1702 to a wire 114 of the first interconnect structure 116. The etching may, for example, be performed by plasma etching or some other suitable etching process. Further, the etching may, for example, be performed selectively using the backside dielectric layer 806 and the TSV dielectric layer 118 as a mask.

Figure 19:
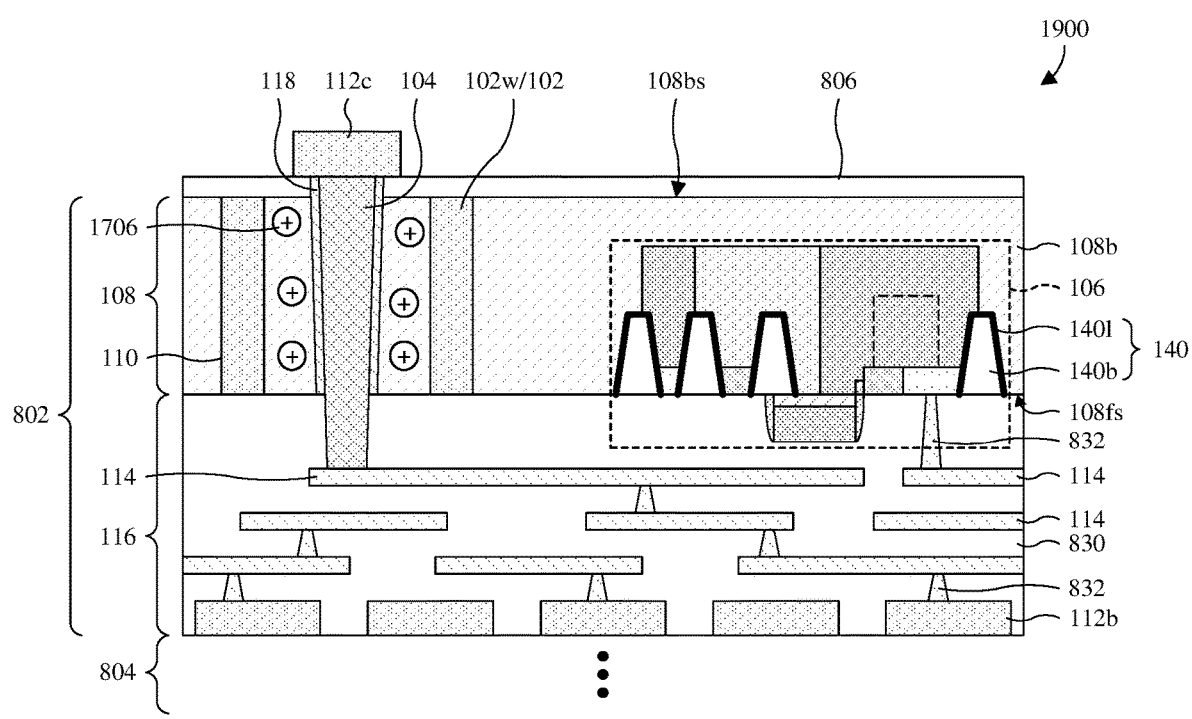

As illustrated by the cross-sectional view 1900 of FIG. 19, a TSV 104 and a contact pad 112*c* are formed. The TSV 104 is formed in the TSV opening 1702 (see FIG. 18), separated from the first substrate 108 by the TSV dielectric layer 118. The contact pad 112*c* is formed on the TSV 104. In some embodiments, a process for forming the TSV 104 and the contact pad 112*c* comprises: 1) depositing a metal layer filling the TSV opening 1702 and covering the backside dielectric layer 806; 2) performing a planarization into the metal layer to flatten a top surface of the metal layer; and 3) patterning the metal layer by a photolithography/etching process to define the contact pad 112*c*. Other processes are, however, amenable. For example, the TSV 104 and the contact pad 112*c* may be formed from separate metal layers.

While FIGS. 9-19 are described with reference to a method, it will be appreciated that the structures shown in FIGS. 9-19 are not limited to the method but rather may stand alone separate of the method. While FIGS. 9-19 are described as a series of acts, it will be appreciated that the order of the acts may be altered in other embodiments. While FIGS. 9-19 illustrate and describe as a specific set of acts, some acts that are illustrated and/or described may be omitted in other embodiments. Further, acts that are not illustrated and/or described may be included in other embodiments. While FIGS. 9-19 illustrate formation of the shield structure 102 according to the embodiments of FIGS. 1A and 1B, FIGS. 9-19 may alternatively form the shield structure 102 according to the embodiments in any one of FIGS. 2A, 2B, 3A, 3B, 4A, 4B, 5, and 6A-6C. In these other embodiments, the top layouts of the first and second masks 904, 1004 respectively at FIGS. 9 and 10 may be modified so as to have openings matching the one or more shield wells in the corresponding embodiments of the shield structure 102. Further, while FIGS. 9-19 illustrate formation of the first semiconductor device 106 according to embodiments of the semiconductor device 106 at FIGS. 1A and 1B, FIGS. 9-19 may alternatively form the first semiconductor device 106 according to embodiments of the semiconductor device 106 in any one of FIGS. 7A-7F.

Figure 20:
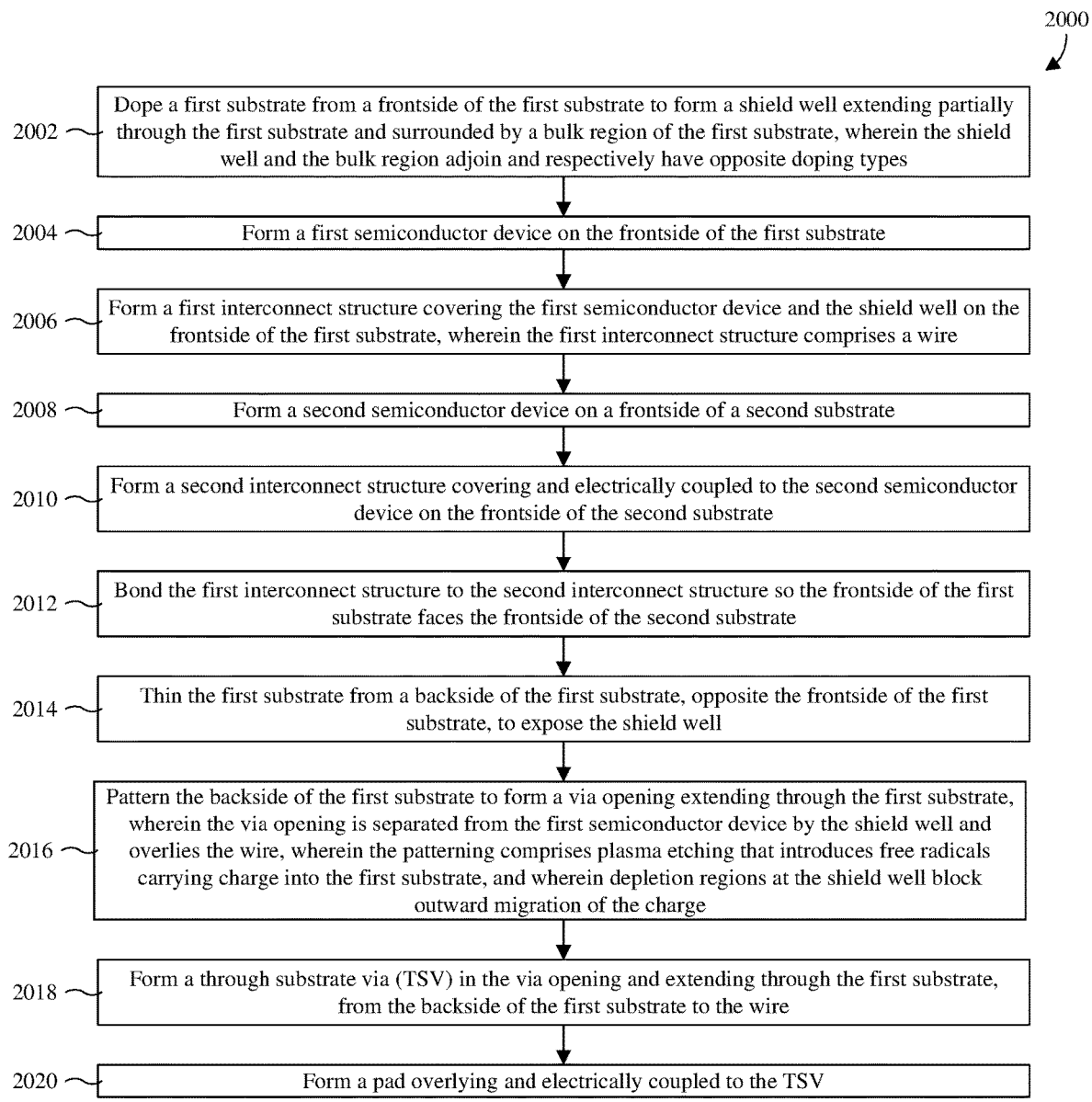
FIG. 20 illustrates a block diagram of some embodiments of the method of FIGS. 9-19.

With reference to FIG. 20, a block diagram 2000 of some embodiments of the method of FIGS. 9-19 is provided.

At 2002, a first substrate is doped from a frontside of the first substrate to form a shield well extending partially through the first substrate and surrounded by a bulk region of the first substrate, wherein the shield well and the bulk region adjoin and respectively have opposite doping types. See, for example, FIGS. 9 and 10.

At 2004, a first semiconductor device is formed on the frontside of the first substrate. See, for example, FIGS. 10-12.

At 2006, a first interconnect structure is formed covering the first semiconductor device and the shield well on the frontside of the first substrate, wherein the first interconnect structure comprises a wire. See, for example, FIG. 13.

At 2008, a second semiconductor device is formed on a frontside of a second substrate. See, for example, FIG. 14.

At 2010, a second interconnect structure is formed covering and electrically coupled to the second semiconductor device on the frontside of the second substrate. See, for example, FIG. 14.

At 2012, the first interconnect structure is bonded to the second interconnect structure so the frontside of the first substrate faces the frontside of the second substrate. See, for example, FIG. 15.

At 2014, the first substrate is thinned from a backside of the first substrate, opposite the frontside of the first substrate, to expose the shield well. See, for example, FIG. 16.

At 2016, the backside of the first substrate is patterned to form a via opening extending through the first substrate, wherein the via opening is separated from the first semiconductor device by the shield well and overlies the wire, wherein the patterning comprises plasma etching that introduces free radicals carrying charge into the first substrate, and wherein depletion regions at the shield well block outward migration of the charge. See, for examples, FIGS. 17 and 18.

At 2018, a TSV is formed in the via opening and extending through the first substrate, from the backside of the first substrate to the wire. See, for example, FIG. 19.

At 2020, a pad is formed overlying and electrically coupled to the TSV. See, for example, FIG. 19.

While the block diagram 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an IC including: a substrate; an interconnect structure on a frontside of the substrate; a semiconductor device on the frontside of the substrate, between the substrate and the interconnect structure; a TSV extending through the substrate, from a backside of the substrate to the interconnect structure; and a shield structure including a first PN junction, wherein the first PN junction extends completely through the substrate and is between the semiconductor device and the TSV. In some embodiments, the interconnect structure includes a wire to which the TSV extends, wherein the wire extends laterally from the TSV to a location directly under the semiconductor device. In some embodiments, the substrate includes a bulk region and a first shield well respectively having opposite doping types, wherein the bulk region and the first shield well extend completely through the substrate and define the first PN junction, and wherein the first shield well has a top layout that extends laterally in a closed path to surround the TSV while remaining spaced from the TSV by the bulk region. In some embodiments, the first PN junction has a top layout that extends laterally in a closed path to surround the semiconductor device. In some embodiments, the substrate includes a bulk region and a first shield well defining the first PN junction, and further includes a second shield well defining a second PN junction with the bulk region, wherein the bulk region has a first doping type and the first and second shield wells have a second doping type opposite the first doping type, and wherein the first and second shield wells each extend completely through the substrate and are directly between the TSV and the semiconductor device. In some embodiments, the first and second shield wells each have a top layout that extends in a closed path around the TSV. In some embodiments, the first shield well has a first top layout extending laterally in a closed path around the TSV, and wherein the second shield well has a second top layout extending laterally in a closed path around the semiconductor device. In some embodiments, the TSV and the semiconductor device are spaced along a common axis, and wherein the first PN junction has a top layout that is line shaped and laterally elongated in a direction transverse to the common axis.

In some embodiments, the present disclosure provides another IC including: a substrate including a bulk region having a first doping type, and further including a first shield well having a second doping type opposite the first doping type, wherein the bulk region and the first shield well directly contact continuously from a frontside surface of the substrate to a backside surface of the substrate opposite the frontside surface; an interconnect structure on the frontside surface of the substrate, wherein the interconnect structure includes a wire; a semiconductor device on the frontside surface of the substrate, between the substrate and the interconnect structure; and a TSV extending through the bulk region of the substrate, from the backside surface of the substrate to the wire, wherein the TSV, the first shield well, and the semiconductor device are spaced from each other along a common axis with at least a portion of the first shield well between the TSV and the semiconductor device. In some embodiments, the first shield well extends laterally in a closed path around the TSV and is spaced from the TSV by the bulk region of the substrate. In some embodiments, the first shield well extends laterally in a closed path around the semiconductor device, but not the TSV. In some embodiments, the first shield well has a top layout that is line shaped and elongated in a direction transverse to the common axis, and wherein a dimension of the first shield well in the direction is greater than that of the semiconductor device. In some embodiments, the substrate further includes a second shield well having the second doping type, wherein the bulk region and the second shield well directly contact continuously from the frontside surface of the substrate to the backside surface of the substrate, and wherein at least a portion of the second shield well is along the common axis between the first shield well and the semiconductor device. In some embodiments, the bulk region separates the first and second shield wells from each other and also from the TSV and the semiconductor device, and wherein the first and second shield wells extend continuously in individual closed paths both surrounding the TSV. In some embodiments, the bulk region separates the first and second shield wells from each other and also from the TSV and the semiconductor device, and wherein the first and second shield wells extend continuously in individual closed paths to respectively surround the TSV and the semiconductor device.

In some embodiments, the present disclosure provides a method for forming an IC, the method including: doping a substrate from a frontside of the substrate to form a first shield well extending partially through the substrate and surrounded by a bulk region of the substrate, wherein the first shield well and the bulk region respectively have opposite doping types; forming a semiconductor device on the frontside of the substrate; forming an interconnect structure covering the first shield well and the semiconductor device on the frontside of the substrate, wherein the interconnect structure includes a wire; thinning the substrate from a backside of the substrate, opposite the frontside of the substrate, wherein the thinning exposes the first shield well from the backside; and forming a TSV extending through the substrate, from the backside of the substrate to the wire, wherein the TSV includes metal and is separated from the semiconductor device by the first shield well. In some embodiments, the first shield well is formed with a ring-shaped top layout surrounding the TSV or the semiconductor device but not both. In some embodiments, the forming of the TSV includes: performing an etch into the backside of the substrate to form a trench laterally separated from the semiconductor device by the first shield well, wherein the etch introduces free radicals carrying positive charge into the substrate, and wherein depletion regions at the first shield well block migration of the free radicals towards the semiconductor device; and filling the trench with metal. In some embodiments, the forming of the TSV includes: performing a first etch into the backside of the substrate to form a trench exposing the interconnect structure, wherein the first etch is a plasma etch; lining sidewalls of the trench with a via dielectric layer; performing a second etch into the interconnect structure with the via dielectric layer in place to expand the trench and expose the wire; depositing a conductive layer in the trench; and performing a planarization into the conductive layer. In some embodiments, the method further includes hybrid bonding an IC chip to the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC), the method comprising:
   doping a substrate from a frontside of the substrate to form a shield well extending partially through the substrate and surrounded by a bulk region of the substrate, wherein the shield well and the bulk region respectively have opposite doping types;
   forming a semiconductor device on the frontside of the substrate;
   forming an interconnect structure covering the shield well and the semiconductor device on the frontside of the substrate, wherein the interconnect structure comprises a wire;
   thinning the substrate from a backside of the substrate, opposite the frontside of the substrate, wherein the thinning exposes the shield well from the backside; and
   forming a through substrate via (TSV) extending through the substrate, from the backside of the substrate to the wire, wherein the TSV comprises metal and is separated from the semiconductor device by the shield well.

2. The method according to claim 1, wherein the shield well is formed with a ring-shaped top layout surrounding the TSV or the semiconductor device but not both.

3. The method according to claim 1, wherein the forming of the TSV comprises:
   performing an etch into the backside of the substrate to form a trench laterally separated from the semiconductor device by the shield well, wherein the etch introduces free radicals carrying positive charge into the substrate, and wherein a depletion region at the shield well blocks migration of the free radicals towards the semiconductor device; and
   filling the trench with the metal.

4. The method according to claim 1, wherein the forming of the TSV comprises:
   performing a first etch into the backside of the substrate to form a trench exposing the interconnect structure, wherein the first etch is a plasma etch;
   lining sidewalls of the trench with a via dielectric layer;
   performing a second etch into the interconnect structure with the via dielectric layer in place to expand the trench and expose the wire;
   depositing a conductive layer in the trench; and
   performing a planarization into the conductive layer.

5. The method according to claim 1, further comprising:
   hybrid bonding an IC chip to the interconnect structure.

6. The method according to claim 1, wherein the doping comprises:
   performing a first doping process to form a deep shield well completely buried in the substrate; and
   performing a second doping process after the first doping process to form a shallow shield well overlapping with the deep shield well, wherein the deep shield well and the shallow shield well share a common doping type and collectively form shield well.

7. The method according to claim 1, wherein the wire overlies both the shield well and the semiconductor device.

8. A method for forming an integrated circuit (IC), the method comprising:
   forming a PN junction extending through a substrate;
   forming a semiconductor device on a frontside surface of the substrate;
   performing a plasma etch into a backside surface of the substrate, opposite the frontside surface of the substrate, to form a via opening extending through the substrate; and
   filling the via opening with metal;
   wherein the plasma etch introduces free radicals carrying charge into the substrate, and wherein the PN junction blocks migration of the free radicals to the semiconductor device.

9. The method according to claim 8, wherein the forming of the PN junction comprises:
   doping the substrate to form a shield well extending in a closed path, wherein the via opening is formed surrounded by the closed path and spaced from the shield well.

10. The method according to claim 8, wherein the forming of the PN junction comprises:
    performing a planarization into the backside surface of the substrate to equalize a height of the PN junction with that of the substrate.

11. The method according to claim 8, wherein the charge carried by the free radicals is positive.

12. The method according to claim 8, wherein the PN junction forms a depletion region, and wherein an electric field of the depletion region sweeps charge at the semiconductor device away from the semiconductor device.

13. The method according to claim 8, further comprising:
    forming a plurality of wires and a plurality of vias alternatingly stacked on a same side of the substrate as the semiconductor device and surrounded by a frontside dielectric layer;
    depositing a dielectric liner layer lining the via opening; and
    performing an additional etch into the frontside dielectric layer, through the via opening and with the dielectric liner layer in place, to extend the via opening to a wire of the plurality of wires, wherein the filling is performed after the additional etch.

14. A method for forming an integrated circuit (IC), the method comprising:
    doping a substrate from a frontside of the substrate to form a shield well having an opposite doping type as an adjoining portion of the substrate;
    forming a semiconductor device laterally spaced from the shield well and on the frontside of the substrate;

depositing a backside dielectric layer covering a backside of the substrate, opposite the frontside of the substrate, and directly contacting the shield well; and forming a through substrate via (TSV) extending through the backside dielectric layer and the substrate;

wherein the shield well is laterally between and spaced from the TSV and the semiconductor device.

15. The method according to claim 14, further comprising:

forming a trench isolation structure extending in to the frontside of the substrate, wherein the trench isolation structure has a segment adjoining a first source/drain region of the semiconductor device, and wherein the substrate has an opposite doping type as the shield well continuously from the shield well to the segment of the trench isolation structure.

16. The method according to claim 15, wherein the forming of the trench isolation structure comprises:

performing an etch into the frontside of the substrate to form a trench;

depositing a silicon nitride layer lining and partially filling the trench;

depositing an oxide layer filling a remainder of the trench over the silicon nitride layer; and performing a planarization into the silicon nitride layer and the oxide layer.

17. The method according to claim 15, wherein the substrate has the opposite doping type as the shield well continuously from the shield well to a dielectric liner directly on sidewalls of the TSV.

18. The method according to claim 14, wherein the shield well is formed extending into the frontside of the substrate to a first depth, and wherein the semiconductor device is formed extending into the frontside of the substrate to a second depth less than the first depth.

19. The method according to claim 18, wherein the forming of the semiconductor device comprises:

doping the substrate from the frontside of the substrate to form a pair of device wells having opposite doping types and directly contacting at a PN junction extending into the substrate to the second depth, and wherein the semiconductor device comprises a gate electrode overlying the PN junction.

20. The method according to claim 14, further comprising:

providing the substrate, wherein the substrate is a p-type semiconductor substrate, wherein the doping dopes the substrate with n-type dopants to form the shield well, and wherein the semiconductor device is formed as an n-channel field-effect transistor.

* * * * *